United States Patent
Alam et al.

(10) Patent No.: US 9,529,672 B2
(45) Date of Patent: Dec. 27, 2016

(54) ECC WORD CONFIGURATION FOR SYSTEM-LEVEL ECC COMPATIBILITY

(71) Applicant: Everspin Technologies, Inc., Chandler, AZ (US)

(72) Inventors: Syed M. Alam, Austin, TX (US); Thomas Andre, Austin, TX (US)

(73) Assignee: Everspin Technologies Inc., Chandler, AZ (US)

( * ) Notice: Subject to any disclaimer, the term of this patent is extended or adjusted under 35 U.S.C. 154(b) by 117 days.

(21) Appl. No.: 14/496,964

(22) Filed: Sep. 25, 2014

(65) Prior Publication Data
US 2016/0092305 A1    Mar. 31, 2016

(51) Int. Cl.
*G11C 29/00* (2006.01)
*G06F 11/10* (2006.01)

(52) U.S. Cl.
CPC ....... *G06F 11/1076* (2013.01); *G06F 11/1012* (2013.01)

(58) Field of Classification Search
None
See application file for complete search history.

(56) References Cited

U.S. PATENT DOCUMENTS

| | | | | |
|---|---|---|---|---|
| 9,112,536 B2 * | 8/2015 | Alam | ................. | G06F 11/1048 |
| 2006/0174172 A1 * | 8/2006 | Nahas | ..................... | G11C 7/22 714/718 |
| 2010/0293439 A1 | 11/2010 | Flynn et al. | | |
| 2012/0260150 A1 * | 10/2012 | Cideciyan | ........... | G06F 11/1008 714/773 |
| 2012/0266050 A1 * | 10/2012 | Cideciyan | ............. | H03M 13/05 714/773 |
| 2013/0013980 A1 * | 1/2013 | Cideciyan | ............. | H03M 13/05 714/773 |
| 2013/0031443 A1 * | 1/2013 | Oh | ..................... | G11C 11/5628 714/773 |
| 2013/0227346 A1 | 8/2013 | Lee | | |
| 2014/0040699 A1 * | 2/2014 | Kuriyama | .......... | H03M 13/1148 714/758 |
| 2014/0380117 A1 * | 12/2014 | Hirano | ................... | G11C 29/78 714/758 |

FOREIGN PATENT DOCUMENTS

WO    WO2011073940    6/2011

OTHER PUBLICATIONS

PCT Search Report and Written Opinion mailed Nov. 30, 2015 for PCT Application No. PCT/US15/52151, 10 pages.

* cited by examiner

*Primary Examiner* — Daniel McMahon
(74) *Attorney, Agent, or Firm* — Lee & Hayes, PLLC

(57) ABSTRACT

A memory device includes memory arrays configured to store pages of data organized into multiple ECC words. The memory device also includes at least one input/output pad for each ECC word associated with a page, such that a first level of error correction may be performed by the memory device on each of the ECC words associated with a page and a second level of error correction is performed on the data output by each of the input/output pads during a particular period of time.

20 Claims, 14 Drawing Sheets

ECC WORD CONFIGURATION FOR SYSTEM-LEVEL ECC COMPATIBILITY

BACKGROUND

Memory devices typically experience some level of inherent random errors during access operations. These errors are expected and can be corrected during operation. However, if an error rate is sufficiently low, typical correction circuits are able to compensate resulting in error free operation of the memory device. Unfortunately, in some types of memory devices, such as magnetic memories or magnetic random access memories (MRAMs), the rate of inherent random errors introduced during access operations is more likely than in other types of memory devices such as dynamic random access memories (DRAMs). In addition on error correction in memory device, system-level error correction is desirable.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
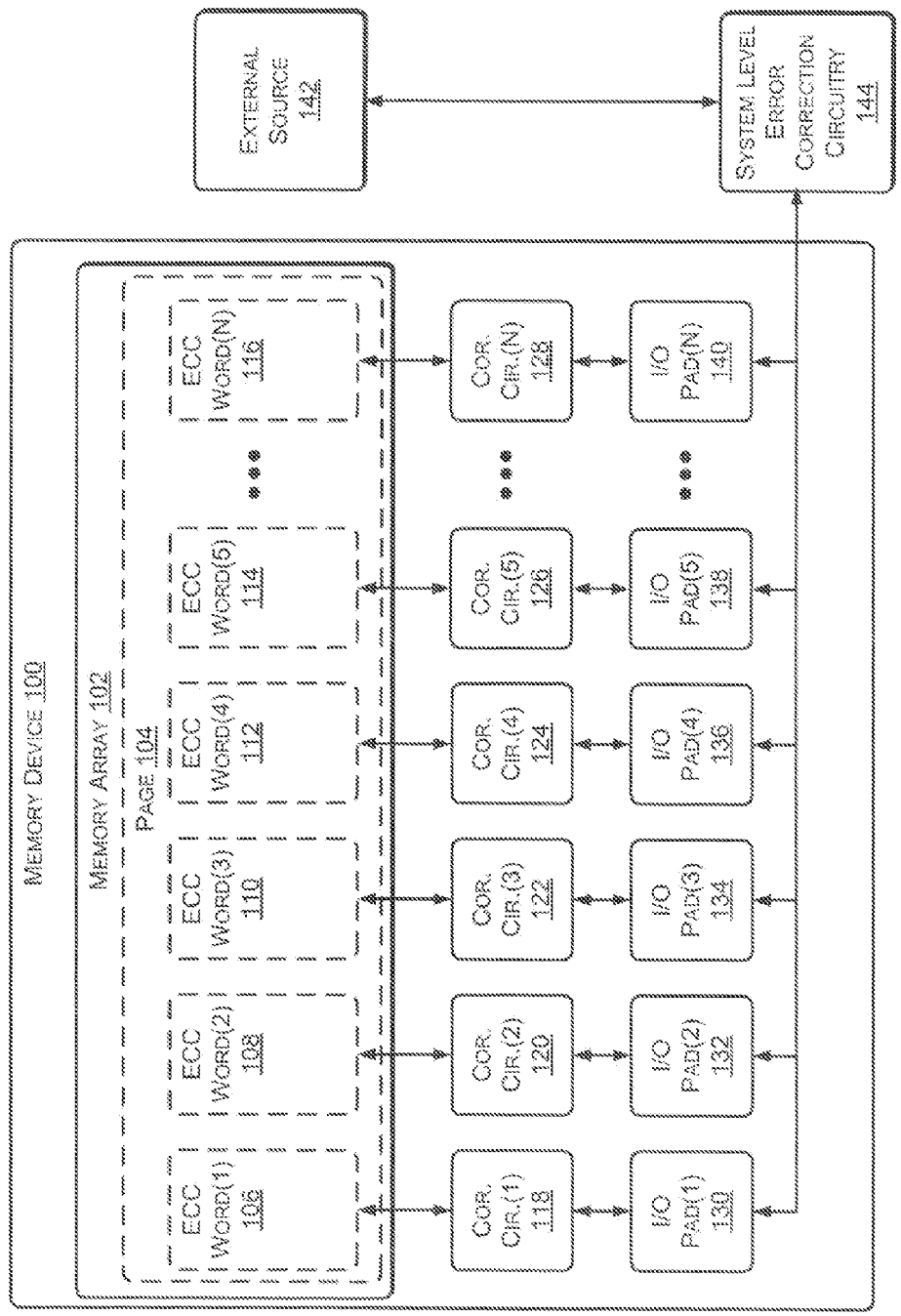
FIG. 1 illustrates an example framework including an example memory device according to some implementations.

This disclosure includes techniques and implementations to improve flexibility and compatibility of memory devices. For example, in some implementations, the memory device may include correction circuitry as illustrated in FIG. 1. In some implementations, the correction circuitry may be configured to perform a first level of (or device level) error correction. An electronic device incorporating the memory device may also include correction circuitry configured to perform a second level of (or system-level) error correction. In order to provide an electronic device having both levels of correction, the first level of correction performed by the memory device may be configured to be orthogonal to the second level of correction performed by the electronic device.

For example, the memory device may include correction circuitry capable of correcting one or more bit errors per error correction code (ECC) word associated with the data being accessed, and the electronic device may include correction circuitry, such as system-level ECC, capable of correcting one or more bit errors per access (e.g., the data output at one time by the input/output pads of the memory device). When data associated with a single ECC word within the memory device is provided on multiple input/output (I/O) pads, errors can be injected at multiple I/O pads when the ECC word within the memory device fails to correct. Such errors at multiple I/O pads can impede the correctability of the system level ECC word. In this manner, implementations are described herein, to configure the memory device and data output at the I/O pads of the memory device from ECC words within the memory device to reduce the likelihood of passing any additional errors per memory access to the correction circuitry performing the second level of correction. For example, an ECC circuitry within the memory device may be configured to correct an error within a single bit and provide data output to multiple I/O pads. The system-level ECC circuitry may be further configured to correct a single error within the data output from the multiple I/O pads (sometimes referred to as a system-level ECC word). In the event memory device's ECC circuitry fails to correct a single bit error at one I/O pad and injects a second bit error in another I/O pad, system-level ECC circuitry also fails to correct at least one of the error that were output by the I/O pads, as two bit errors were output by the I/O pad.

In one implementation, a memory device may include memory arrays having data arranged to include multiple ECC words per page. The memory device may also be configured to include at least one input/output (I/O) interface or pad for each of the ECC words associated with a page. In this implementation, the memory device may be configured to read or write the page of data in multiple accesses, such that for each access associated with reading and/or writing data to the page, the data provided by each of the I/O pads is from a different ECC word, thereby improving the overall efficiency of the memory device. In some particular examples, each of the I/O pads may be dedicated to a particular ECC word (e.g., the first ECC word of each page), while in other examples, each of the I/O pads merely receive data from a different ECC word.

For example, in some systems, there may be multiple ECC words associated with a page, each ECC word capable of correcting a single error, however, errors may pass through an ECC word when multiple errors exist in the ECC word. In these systems with first and second levels of error correction each capable of correcting a single bit error, if the data associated with an access (e.g., the data output at one time by the I/O pads) is also associated with a single ECC word, the first level of error correction associated with the memory device may be able to correct a first error and, if a second error results in one error being passed to the second level of error correction, the second level of error correction associated with the system or electronic device may be able to correct a second error. However, often a second error results in two or three errors being passed from the first level to the second level of error correction and the passed errors typically remain uncorrected.

Alternatively, if the data associated with an access (e.g., the data output at one time by the I/O pads) is associated with multiple ECC words and two or more errors occur within the same ECC word, each of the errors is associated with a different access. In this manner, the first level of error correction associated with the memory device may result in two or three failures, as described above. However, the second level of error correction or the system level error correction may be able to correct the two or three errors, as each error is passed from the first level of error correction to the second level of error correction at different accesses. In other words, the errors may be output by the I/O pads at different times, thereby allowing the second level of error correction to correct the errors.

In one particular implementation, the ECC words associated with the page may be arranged as columns within the memory array and each access may be associated with reading and/or writing data to or from a column associated with the page. For example, if the page size is 512 bits and the memory device includes eight I/O pads, the memory device may be configured with 64 columns associated with each of the eight I/O pads. In this manner, each page includes eight 64 bit ECC words arranged (e.g., one ECC word per I/O). Thus, each access may be associated with a single column that includes one bit per ECC word.

In some examples, to improve the processing speed associated with the memory device, the memory device may be configured such that for adjacent accesses, the same I/O pad does not receive data associated with the same ECC word. For example, due to routing and other considerations associated with the memory array, having the same ECC word associated with the same I/O pad results in some of the data being processed quickly and other data being processed slowly. However, by interleaving or alternating the particular I/O pad that services data associated with particular ECC words, the time associated with processing and/or routing the data associated with each ECC word may be averaged, thereby resulting in overall improvements of access speeds associated with the memory device. For instance, in one implementation, the memory device may be configured such that every two ECC words share two I/O pads with the data associated with each of the two ECC words alternating between the two I/O pads per access.

In some implementations, the data may be read from the memory array and stored within a cache before the data is passed to the I/O pads. For example, the entire page may be processed one ECC word at a time, and the data may be stored in a cache until the entire page is ready for output by the I/O pads. Once the entire page is stored within the cache, the data associated with the page may be provided to the I/O pads one bit of data from each ECC word at a time. For example, if the ECC words associated with the page are arranged as columns within the cache, as discussed above, each access may be associated with reading and/or writing data to or from a row associated with the page. For instance, if the page size is 512 bits and the memory device includes eight I/O pads, the memory device may be configured with eight 64 bit ECC words per page, such that the entire page may be output by the I/O pads as part of 64 separate eight bit accesses (e.g., one bit per ECC word per access).

In some cases, the memory device may be configured to process two or more internal pages of data each having multiple ECC words, in response to a single access request from an external source to access one external page of data. For example, some electronic devices may have an external source configured to read or write data according to an external page size and a memory device configured to process data based on an internal page size. In one particular example, the memory device may include 512 bit internal pages of data, with each page having eight 64 bit ECC words. In this example, the external source may issue a command to read 1024 bits of data (e.g., an external page equivalent to two internal pages) from the memory array.

In some implementations, the memory device may be configured with at least one I/O pad and/or one error correction circuitry per ECC word per external page (e.g., at least sixteen I/O pads in the current example). However, the power consumption or peak currents associated with accessing sixteen ECC words at one time may be too high for some memory devices to accommodate. Therefore, in this example, the memory device may be configured to time multiplex the accesses of the two internal pages. For example, the memory device may be configured to process the first page of data during a first period of time and to process the second page of data during a second period time following the first period of time. For example, the memory device may process the first page and store the first page in a cache and may then process the second internal page and store the second internal page in the cache. Once the data associated with both pages is stored in the cache, the memory device may access the data for output on sixteen I/O pads or one bit per access (e.g., one bit per eight ECC words per page).

In one particular example, the memory device may be configured to interleave the accesses associated with the first page of data and the second page of data stored in the cache to improve processing times and/or to reuse the I/O pads. For example, during the first access the memory device may output the first eight bits (e.g., one bit per ECC word) of the first page to the eight I/O pads, and during the second access the memory device may output the first eight bits (e.g., one bit per ECC word) of the second page to the eight I/O pads.

In another example, the memory device may be configured with sixteen I/O pads, while still interleaving the access per internal page. For example, during the first access the memory device may output the first eight bits (e.g., one bit per ECC word) of the first page to the first set of eight I/O pads and during the second access the memory device may output the first eight bits (e.g., one bit per ECC word) of the second page to the second set of eight I/O pads. The memory device may then provide the data on all sixteen I/O pads to the external source or error correction circuitry associated with the second level of error correction at one time. In some implementations, each of the I/O pads may be configured to provide the data associated with each access to another cache or temporary storage associated with the external source or the electronic device incorporating the memory device.

In some implementations, the memory device may be configured to include multiple modes of operations, each of the modes of operations indicating a different internal page size. In addition, the memory device may include an x8 mode for 8 I/O pads as well as x16 mode for 16 I/O pads. In some instances, the mode may be set using one or more programmable registers, fuse programmable registers, initialization registers, and/or as part of a command received from the external source. In this implementation, the external source may provide or issue an activate command that causes the memory device to load one internal page (512 bits) of data in the x8 mode into a cache or two internal pages (1024 bits) of data into the cache in the x16 mode based on the number of ECC words per page and the number of I/O pads available as described above.

In the examples described above, the error correction circuitry is configured to correct one error per ECC word. However, in other implementations, the error correction circuitry may be capable of correcting more than one error per ECC word, for instance, N errors. Thus, some of the implementations described herein are configured to reduce the likelihood of passing more than N errors per memory access to the correction circuitry performing the second level of ECC correction.

FIG. 1 illustrates an example framework including an example memory device 100 according to some implementations. In the illustrated example, the memory device 100 is shown including a memory array 102 storing a page 104 of data arranged in multiple ECC words 106-116. In the present example, each of the ECC words 106-116 is shown with a dedicated correction circuit 118-128 and a dedicated I/O pad 130-140. However, in other examples described below, the correction circuitry 118-128 and the I/O pads 130-140 may not necessarily be designated or assigned to a particular one of the ECC words 106-116, as long as each I/O pad 130-140 is configured to receive data from a different ECC word 106-116 per access operation.

In general, the data associated with the page 104 is accessed or provided to the I/O pads 130-140 to make the data available to an external source 142. In general, the external source 142 issues or provides a command (e.g., an activate, a precharge, a read, or a write command) to access a page of data, such as the page 104, to the memory device 100. In response, the memory device provides the page 104 to the I/O pads 130-140, such that system level error correction circuitry 144 receives one bit per access from each of the ECC words 106-116 associated with the page 104 in order to provide independent or orthogonal error correction. For instance, assume that each of error correction circuitry 118-128 and system level error correction circuitry 144 can correct one bit error.

For example, in response to an activate command to prepare the page 104 for access by the external source 142, the memory device 100 may access or provide the data stored in the page 104 to the error correction circuitry. Once the data is processed by the error correction circuitry, the data may be output by the I/O pads 130-140 one bit per ECC word 106-116 to the system level error correction circuitry 144 as part of a single access.

For instance, in the illustrated example, assume that multiple errors occurred within the ECC word 106, which may not be corrected by the correction circuit 118. The data is output by the I/O pads 130-140 as accesses or data blocks including one bit from each ECC word 106-116. In this instance, assume multiple errors occurred within the ECC word 106, causing multiple errors to pass through the correction circuit 118 without being corrected.

The errors within ECC word 106 may be distributed to, or create new errors that are passed to, the system level error correction circuitry 144, as the correction circuit 118 may be unable to correct the errors within the ECC word 106, in some implementations. However, after the I/O pads 130-140 output the data associated with a first of the errors to the system level error correction circuitry 144, the system level error correction circuitry 144 is able to correct the first error, as the first error is a single error within the current access including one bit per ECC word 106-116. Likewise, the system level error correction circuitry 144 is able to correct additional errors within the ECC word 106, as each additional error may be the only error per access (e.g., the data output by the I/O pads 130-140 at a particular time).

Additionally, even if an error occurred within another ECC word, such as ECC word 108, the correction circuit 120 is able to correct the error. Thus, in order for an error to escape the system level error correction circuitry 144, a second error would need to occur within both ECC word 106 and ECC word 108 during the same access, as the correction circuitry 118 is able to correct the first error within the ECC word 106 and the correction circuitry 120 is able to correct the first error within the ECC word 108. In this manner, by organizing the memory device 100 to output data to the system level error correction circuitry 144 in accesses having bits of data from different ECC words 106-116, the on-device error correction may be considered orthogonal to the system level error correction circuitry 144.

Figure 2:
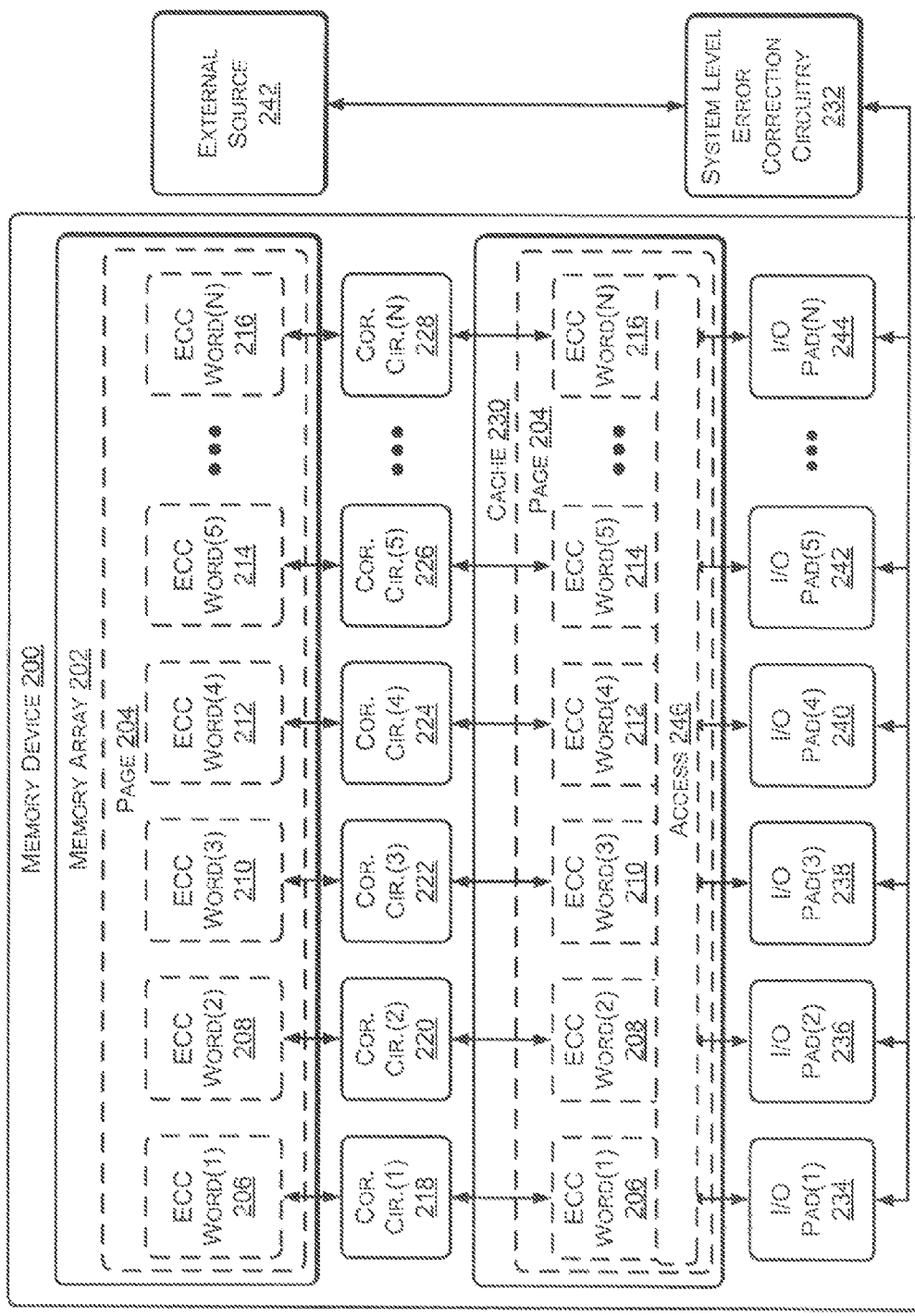
FIG. 2 illustrates an example framework including another example memory device according to some implementations.

FIG. 2 illustrates an example framework including another example memory device 200 according to some implementations. In the illustrated example, the memory device 200 is shown including a memory array 202 storing a page 204 of data arranged in multiple ECC words 206-216. In the present example, as illustrated, the page 204 of data including each of the ECC words 206-216 has been processed by the correction circuitry 218-228 and stored in a cache 230 before being output to system level error correction circuitry 232 via a particular I/O pad of multiple I/O pads 234-244.

For instance, in some implementations, the data associated with the page 204 may be processed by the correction circuitry 218-228 one ECC word at a time. For example, the ECC word 206 may be processed by correction circuitry 218 and stored in the cache 230 at a time t1, the ECC word 208 may be processed next at a time t2, followed by the ECC word 210 at time t3 through ECC word 216 at time tN. Thus, in the illustrated example, the page 204 stored in the memory array 202 may be read one ECC word at a time, processed by the corresponding correction circuitry 218-228, and reconstructed in the cache 230. In another implementation, the data associated with the page 204 may be processed by the correction circuitry 218-228 for all ECC words in parallel at the same time.

Once the page 204 is stored in the cache 230, the data in the cache 230 may be accessed or provided to the I/O pads 234-244 as an access having one bit from each of the ECC words 206-216. In this manner, the system level error correction circuitry 232 is able to correct one error per access before the external source 242 is provided the data associated with the page 204.

In one example, in response to an activate command to prepare the page 204 for access by the external source 242, the memory device 200 may access the data associated with the page 204 that is stored in the memory array 202 and may provide the data associated with each of the ECC words 206-216 to the corresponding correction circuitry 218-228. The memory device 200 may reconstruct the page 204 in the cache 230. The memory device 200 may then access or provide the data associated with the page 204 to the I/O pads 234-244 one bit from each of the ECC words 206-216 at a time to each of the I/O pads 234-244 (e.g., N total bits), as illustrated by access 246. The set of N bits are received by the system level error correction circuitry 232 as a single access, such that the system level error correction circuitry 232 is able to correct one error per access 246.

In one particular example, assume that multiple errors occurred within ECC word 206 and a single error occurs within ECC word 208. In this example, the data associated with ECC word 206 is processed by the correction circuitry 218 and the errors within the ECC word 206 may or may not be corrected. The ECC word 208 is processed next by correction circuitry 220 and the correction circuitry 220 is able to correct the single error within the ECC word 208. Next, the remaining ECC words 210-216 are processed by the corresponding correction circuitry 222-228, and the correction circuitry 222-228 may correct one error per ECC word 210-216.

After the correction circuitry 218-228 has processed each ECC word 206-216, the data associated with the page 204 is collected within the cache 230. The memory device 200 provides the data stored in the cache 230 to the I/O pads 234-244, N bits per access 246, such that one bit comes from each of the ECC words 206-216. In this way, as the N bits are output to the system level error correction circuitry 232, each access 246 includes one bit for each of individual ECC words 206-216. Thus, the system level error correction circuitry 232 is able to correct each additional error within the ECC word 206, as the other error within ECC word 208 was corrected by correction circuitry 220 and only one error per access remains within the page 204.

Figure 3:
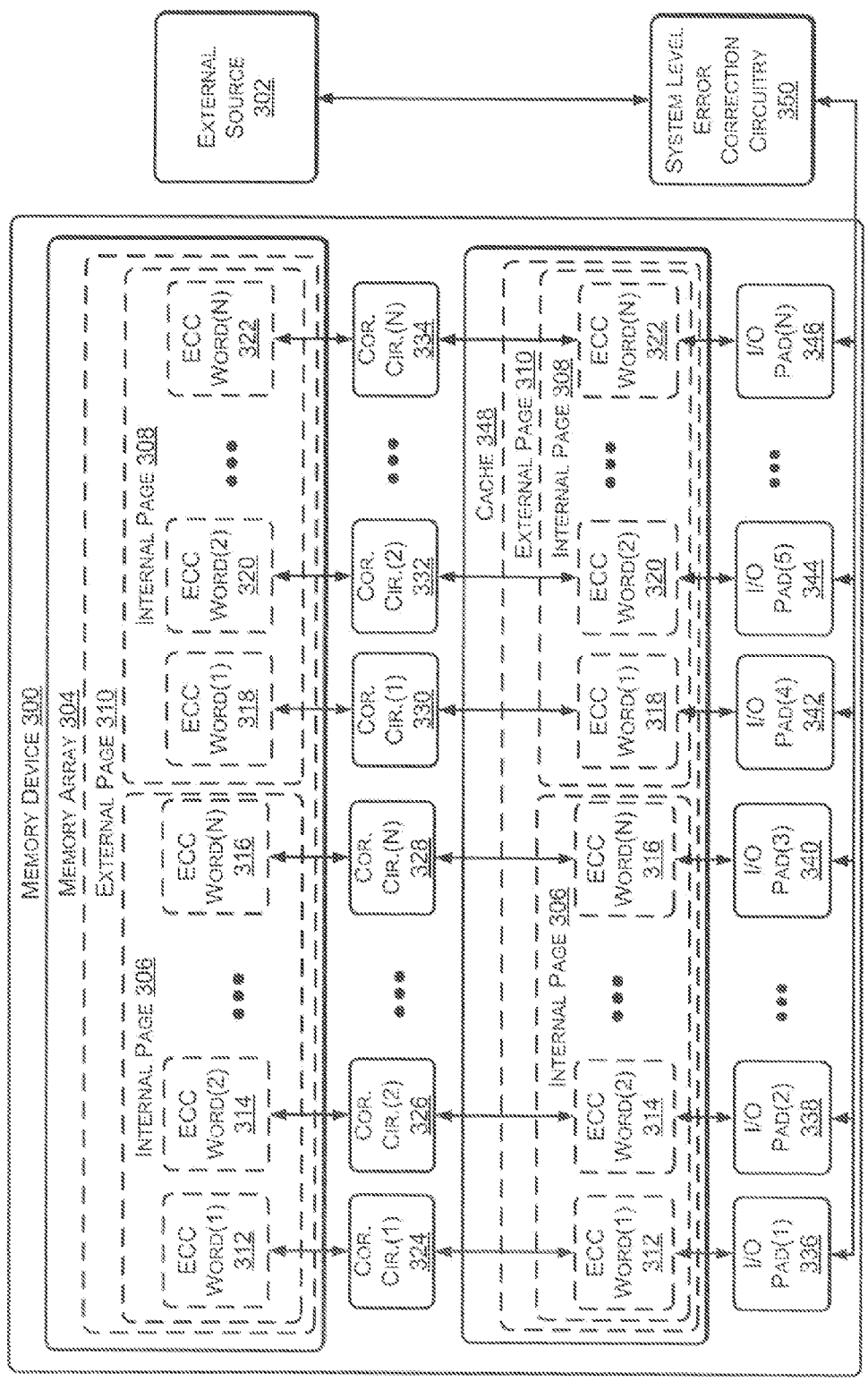
FIG. 3 illustrates an example framework including another example memory device according to some implementations.

FIG. 3 illustrates an example framework including another example memory device 300 according to some implementations. The memory device 300 is configured with at least two modes of operation. In the first mode of operation, the memory device 300 may be configured to provide one internal page of data in response to receiving a command from an external source 302. Alternatively, in a second mode of operation, the memory device 300 may be configured to provide two internal pages of data in response to receiving a command from the external source 302. In some implementations, the memory device 300 may be further configured to operate in an x8 mode or in an x16 mode to improve flexibility of the memory device 300.

In the illustrated example, the memory device 300 is shown as having a memory array 304 having two internal pages 306 and 308, which together equal the size of an external page 310 associated with the external source 302. Each of the internal pages 306 and 308 are arranged in N ECC words. For instance, the internal page 306 includes ECC words 312-316 and the internal page 308 also includes ECC words 318-322. In the illustrated example, the memory device 300 includes a correction circuit 324-334 and an I/O pad 336-346 dedicated to each of the ECC words 312-322 associated with either of the internal pages 306 and 308. In this manner, the memory device 300 may be configured to accommodate an external source 302 that issues commands according to the internal page size or according to an external page size equal to twice the internal page size.

In one specific example, the memory device 300 may include an x8 mode (where only 8 I/O pads are used) and an x16 mode (where only 16 I/O pads are used). In this example, each internal page 306 and 308 may be arranged with eight 64 bit ECC words. The memory device 300 may provide an internal page in response to a command received when the x8 mode is active and may provide two internal pages (e.g., an external page) in response to a command received when the x16 mode is active. By providing two internal pages in the x16 mode, it can be ensured that each I/O pad is associated with one bit per ECC word and no ECC word is shared among the I/O pads during an access. In some cases, the mode of the memory device 300 may be set by one or more fuse programmable registers, one or more initialization registers, and/or as part of an activate command received from the external source 302.

In general, when the memory device 300 receives an activate command associated with the external page 310 from the external source 302, the memory device 300 begins processing or loading the first internal page 306 and the second internal page 308 associated with the external page 310 into a cache 348. In some implementations, the memory device 300 may time multiplex the processing of the first internal page 306 and the second internal page 308, such that during a first period of time the memory device 300 processes the first internal page 306 and during a second period of time the memory device 300 processes the second internal page 308. For example, during the first period of time, the memory device 300 may provide the data associated with the ECC words 312-316 to the correction circuitry 324-328, followed by the data associated with the ECC words 318-322 to the correction circuitry 330-334.

Once the data associated with both the first and second internal pages 306 and 308 are stored within the cache 348, the memory device 300 begins outputting the data associated with the external page 310 to the I/O pads 336-346 in accesses including one bit from each of the ECC words 312-322 associated with both the internal pages 306 and 308. Such accesses can be initiated by the external source 302 using a read command. In some examples, the memory device 300 may perform a single access to collect one bit per ECC word 312-322 and to provide the bits to the I/O pads 336-346 at one time for output to a system level error correction circuitry 350 associated with the electronic device. In other examples, as will be described in more detail below with respect to FIGS. 5-7, the memory device 300 may perform a first access associated with the first internal page 306 to load one bit per ECC word 312-316 onto the I/O pads 336-340 and a second access associated with the second internal page 308 to load one bit per ECC word 318-322 onto I/O pads 342-346, before the memory device 300 outputs the bits to the system level error correction circuitry 350.

As described above with respect to FIGS. 1 and 2, the correction circuitry 324-334 may correct one error per ECC word 312-322, and the system level error correction circuitry 350 may correct one error per access when each access includes bits from different ECC words. Thus, in the illustrated example, the memory device 300 is capable of processing two internal pages 306 and 308 using internal correction circuitry 324-334, while outputting sixteen bits per access to allow the system level correction circuitry 350 to act as an orthogonal error correction.

While the implementation illustrated with respect to FIG. 3 shows a memory device 300 configured to provide two internal pages of data in response to a command form the external source 302, it should be understood that in other implementations the memory device 300 may be configured to provide more than two internal pages in response to a command from the external source 302.

Figure 4:
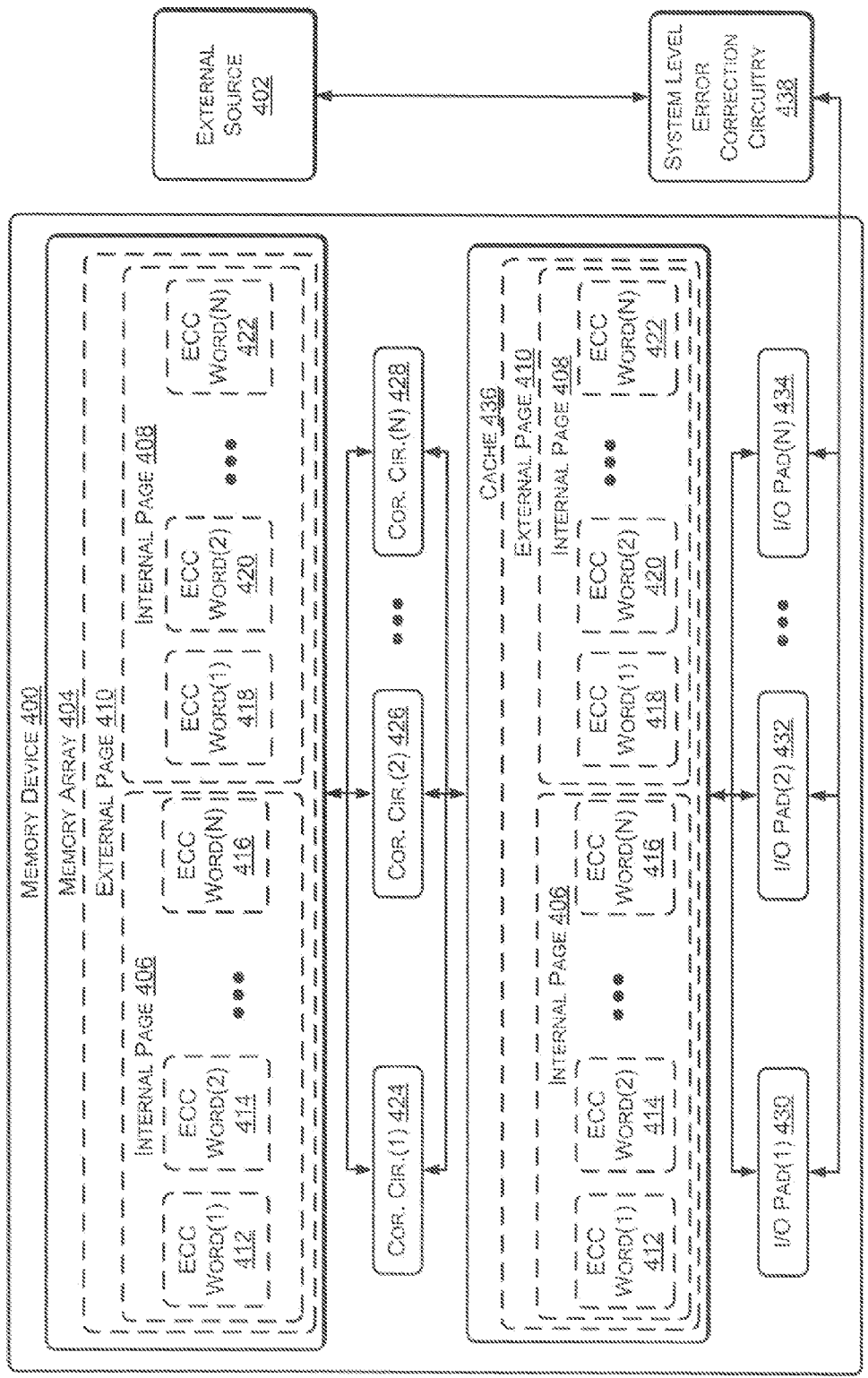
FIG. 4 illustrates an example framework including another example memory device according to some implementations.

FIG. 4 illustrates an example framework including another example memory device according to some implementations. As discussed above with respect to FIG. 3, the memory device 400 is configured with at least two modes of operation. In the first mode of operation, the memory device 400 may be configured to provide one internal page of data in response to receiving a command from an external source 402. Alternatively, in a second mode of operation, the memory device 400 may be configured to provide two internal pages of data in response to receiving a command from the external source 402. Furthermore, the memory device 400 may be configured to operate in an x8 mode or in an x16 mode in order to allow the memory device 400 to be operable or compatible with a wider range of external devices (e.g., the external source 402 of FIG. 4).

In the illustrated example, the memory device 400 is shown as including a memory array 404 having two internal pages 406 and 408, which together equal the size of an external page 410 associated with the external source 402. Each of the internal pages 406 and 408 are arranged in N ECC words. For instance, the internal page 406 includes ECC words 412-416 and the internal page 408 also includes ECC words 418-422. However, unlike the example of FIG. 3, the illustrated example of FIG. 4 illustrates the memory device 400 includes N correction circuits 424-428 and N I/O pads 430-434. In this example, the memory device 400 is configured such that there is at least one correction circuit and I/O pad per ECC word per page, such that in the first mode the memory device 400 has one correction circuitry and one I/O pad per ECC word associated with the internal page.

In the second mode (e.g., the mode in which two internal pages equals an external page), the memory device 400 is configured to time multiplex the processing of each page, such that the correction circuits 424-428 and the I/O pads 430-434 may be reused to process each of the internal pages 406 and 408. In this manner, the memory device 400 may be configured to accommodate an external source 402 that issues commands according to the internal page size or an external page size different from the internal page size without requiring additional correction circuits or I/O pads.

In one specific example, the memory device 400 may include an x8 mode (e.g., a 512 bit page size mode) and an x16 mode (e.g., a 1024 bit page size mode). In this example, each internal page 406 and 408 may be arranged with eight 64 bit ECC words. The memory device 400 may provide an internal page in response to a command received when the x8 mode is active and may provide two internal pages (e.g., an external page) in response to a command received when the x16 mode is active. In some cases, the mode of the memory device 400 may be set by one or more fuse programmable registers, one or more initialization registers, and/or as part of an activate command received from the external source 402.

In general, when the memory device 400 receives an activate command associated with the external page 410 from the external source 402, the memory device 400 begins processing or loading the internal first page 406 and the second internal page 408 associated with the external page 410 into a cache 436. In the illustrated example, the memory device 400 time multiplexes the processing of the internal first page 406 and the second internal page 408, such that during a first period of time the memory device 400 processes the internal page 406 and during a second period of time the memory device 400 processes the second internal page 408. Furthermore, processing of each ECC word 412-416 in internal page 406 and 418-422 in internal page 408 can be time multiplexed in other embodiments. For example, during the first period of time, the memory device 400 may provide the data associated with the ECC word 412 to the correction circuitry 424, followed by the data associated with the ECC word 414 to the correction circuitry 426, and so forth until the data associated with each of the ECC words up to ECC word 416 has been processed by the corresponding correction circuitry 424-428.

Once the data associated with the first internal page 406 is processed and the first period of time has elapsed, the memory device 400 begins processing the second internal page 408. For example, during the second period of time, the memory device 400 may provide the data associated with the ECC word 418 to the correction circuitry 424. Following the second period of time, the memory device 400 may provide the data associated with the ECC word 420 to the correction circuitry 426, and so forth until the data associated with each of the ECC words up to ECC word 422 has been processed by the corresponding correction circuitry 424-428. In this example, the correction circuitry 424-428 may be reused during first and second time periods associated with processing each of the internal pages 406 and 408 when the memory device 400 is in the second mode.

Once the data associated with both the first and second internal pages 406 and 408 are stored within the cache 436, the memory device 400 provides the data associated with the external page 410 to the I/O pads 430-434. In the illustrated example, the memory device 400 may also time multiplex the output of the data by the I/O pads 430-434 by reusing the I/O pads 430-434 with respect to both the internal pages 406 and 408. For example, the memory device 400 may output eight bits associated with the first internal page 406 (e.g., one bit per ECC word associated with the first page) to the I/O pads 430-434, then output the eight bits associated with the second internal page 408 (e.g., one bit per ECC word associated with the second page) to the I/O pads 430-434.

In other examples, the memory device 400 may include N ECC words per internal page and N correction circuits but 2*N I/O pads, such that the memory device 400 may time multiplex and reuse the correction circuits 424-428 during the processing of each of the internal pages 406 and 408, as the pages are loaded into the cache 436, while still outputting the data according the number of ECC words associated with the external page 410. In either example, the I/O pads 430-434 provide one bit per ECC word as part of each access to the system level error correction circuitry 438, such that the system level error correction circuitry 438 is orthogonal to the memory device level error correction.

Yet in another implementation, the memory device 400 may be configured to interleave data from internal pages 406-408 on I/O pads 430-434 during a single access from the external source 402. For example, I/O pad 430 is coupled to (i.e., provides data to and from) ECC word 412 of internal page 406 while I/O pad 432 is coupled to ECC word 418 of internal page 410 during a first access. During a second access, the I/O pad 430 is coupled to ECC word 418 of internal page 410 while I/O pad 432 is coupled to ECC word 412 of internal page 406. Such interleaving of ECC words from internal pages 406-410 during memory accesses are desirable when the I/O pads 430 and 432 are physically close (short on-device routing) to ECC words 412 and 418 in the memory device 400. In this implementation, the I/O pads 430-434 provide one bit per ECC word as part of each access to the system level error correction circuitry 438, such that the system level error correction circuitry 438 is orthogonal to the memory device level error correction.

Figure 5:
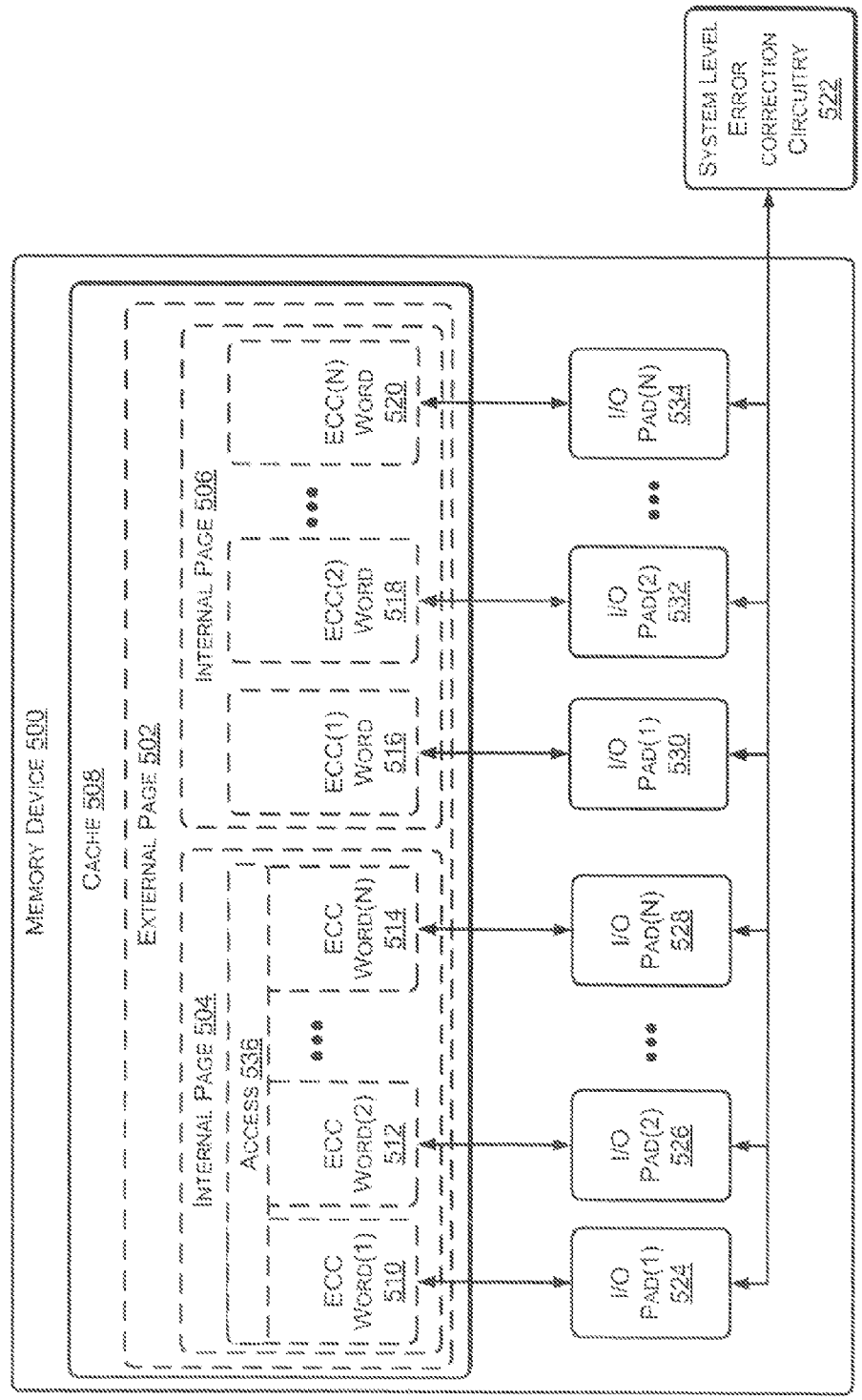
FIG. 5 illustrates an example framework including an example memory device configured to time multiplex data output during a first time period.

FIG. 5 illustrates an example framework including an example memory device 500 configured to time multiplex data output during a first time period. In the illustrated example, the memory device 500 has loaded an external page 502 of data equal to two internal pages 504 and 506 into a cache 508. The first internal page 504 includes multiple ECC words 510-514 and the second internal page 506 includes multiple ECC words 516-520. In the illustrated example, each of the ECC words 510-520 have been processed by the error correction circuitry associated with the memory device 500 one page at a time, as described above, and are ready to be output to the system level error correction circuitry 522 by I/O pads 524-534.

In some implementations, the power consumption or peak currents associated with accessing too many ECC words at one time may be too high for some memory devices to accommodate. Therefore, in this example, the memory device 500 may be configured to time multiplex the accesses of the two internal pages 504 and 506. For example, as illustrated, the memory device 500 may be configured to access 536 the internal page 504 during a first period of time and to access the internal page 506 during a second period of time following the first period of time. Thus, in the illustrated example, the memory device 500 is accessing bits (one bit per ECC word 510-514) associated with the first internal page 504 for output by the I/O pads 524-528 to the system level error correction circuitry 522, as shown below with respect to FIG. 6. During a second period of time, the memory device 500 is accessing bits (one bit per ECC word 516-520) associated with the internal page 506 for output by the I/O pads 530-534 to the system level error correction circuitry 522.

Figure 6:
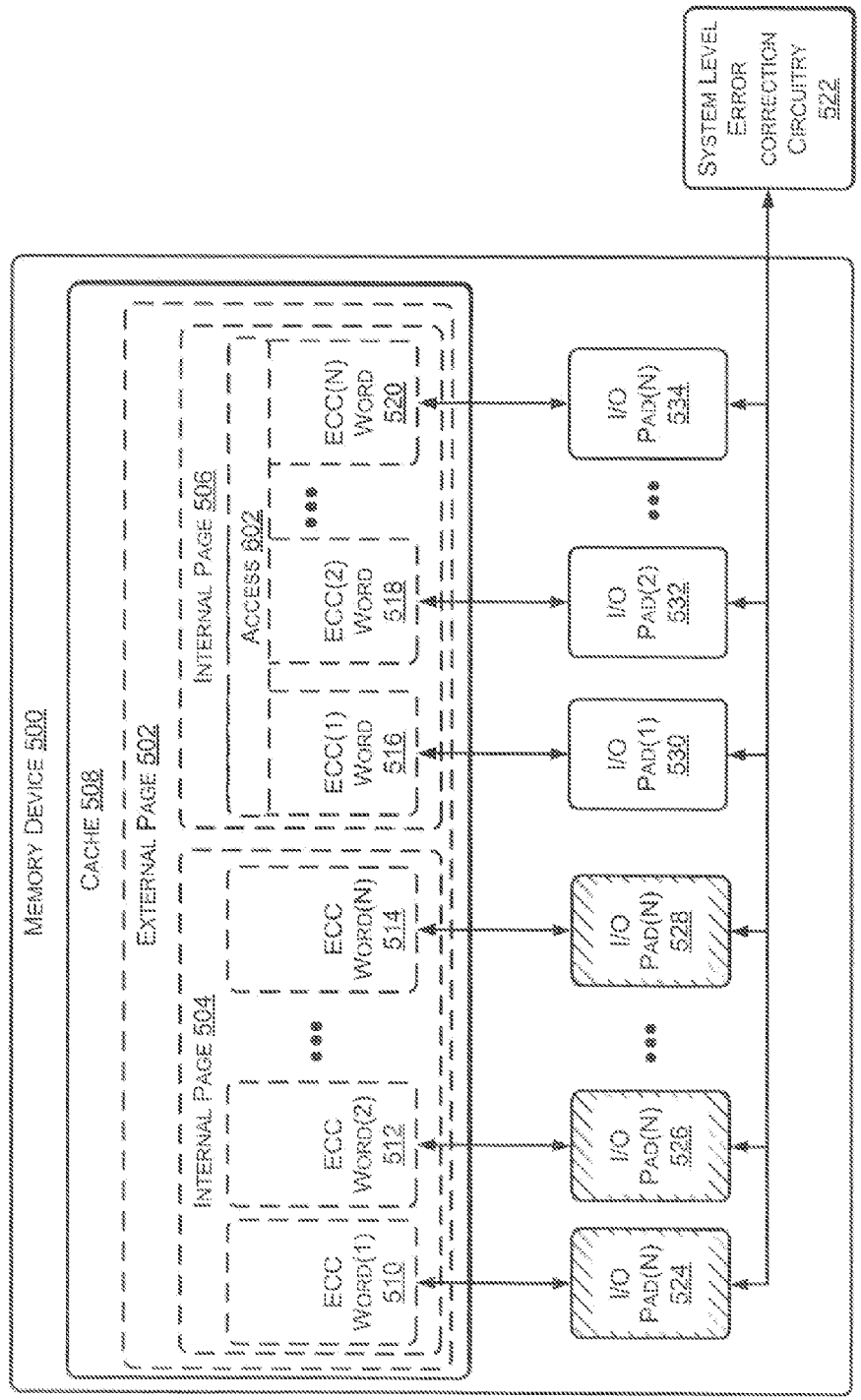
FIG. 6 illustrates an example framework including an example memory device configured to time multiplex data output during a second time period.

FIG. 6 illustrates an example framework including an example memory device 600 configured to time multiplex data output during a second time period. In the illustrated example, the memory device 500 has loaded an external page 502 of data equal to two internal pages 504 and 506 into a cache 508 and the memory device 500 has provided at least a portion of the internal page 504 to the I/O pads 524-528. As described above with respect to FIG. 5, the internal page 504 includes multiple ECC words 510-514 and the internal page 506 includes multiple ECC words 516-520. In the illustrated example, each of the ECC words 510-520 have been processed by the error correction circuitry associated with the memory device 500 one page at a time, as described above, and are ready to be output to the system level error correction circuitry 522 by the I/O pads 524-534.

In the present example, the memory device 500 may be configured to time multiplex the accesses of the two internal pages 504 and 506. For example, as illustrated, the memory device 500 may be configured to access the internal page 504 during a first period of time (shown as 536 in FIG. 5) and to access the internal page 506 during a second period of time following the first period of time (shown as 602 in FIG. 6). Thus, in the illustrated example, the memory device 500 is accessing bits (one bit per ECC word 516-520) associated with the second internal page 506 for output by the I/O pads 530-534 to the system level error correction circuitry 522 during a second period of time.

Figure 7:
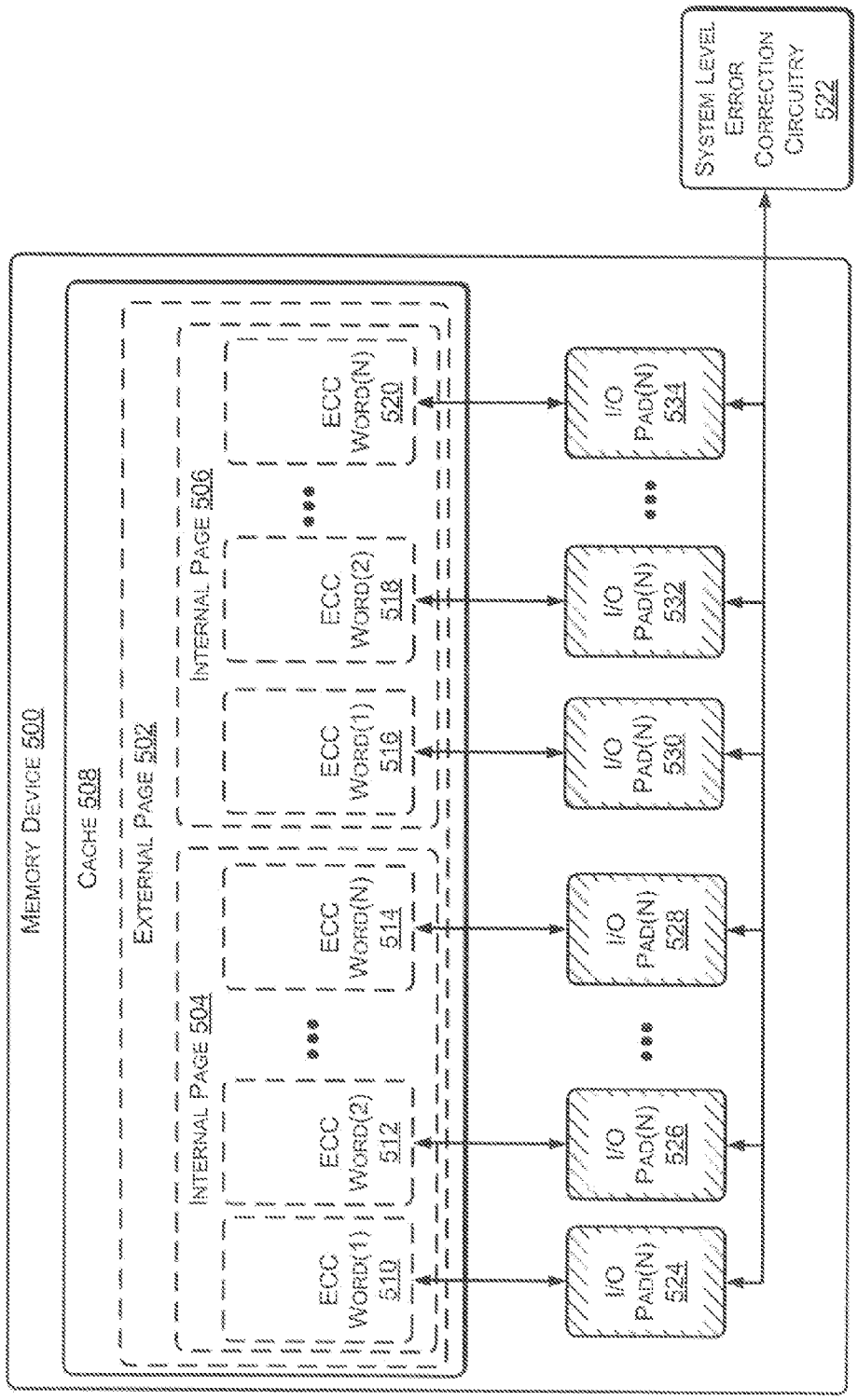
FIG. 7 illustrates an example framework including an example memory device configured to time multiplex data output during a third time period.

FIG. 7 illustrates an example framework including an example memory device 700 configured to time multiplex data output during a third time period. In the illustrated example, the memory device 500 has accessed both internal pages 504 and 506 to provide data associated with each ECC word onto the I/O pads 524-534. In this example, the memory device 500 is ready to output the data on each I/O pad 524-534 to the system level error correction circuitry 522.

In this manner, the memory device 500 may output the data associated with both internal pages 504 and 506 and stored in the cache 508 via the I/O pads 524-534 to the system level error correction circuitry 522 as if the internal pages 504 and 506 were a single external page 502. In this example, the system level error correction circuitry 522 may treat each of the accesses 536 (as shown in FIG. 5) and 602 (as shown in FIG. 6) as a single access. In this manner, the system level error correction circuitry 522 may provide orthogonal error checking on the combined accesses, as each bit associated with the I/O pads 524-534 is associated with a different ECC word 510-520. In some implementations, the memory device 500 may repeat providing data from the internal page 504 and the internal page 506 to the I/O pads 524-534 until the data associated with the external page 502 is output to the system level error correction circuitry 522.

Figure 8:
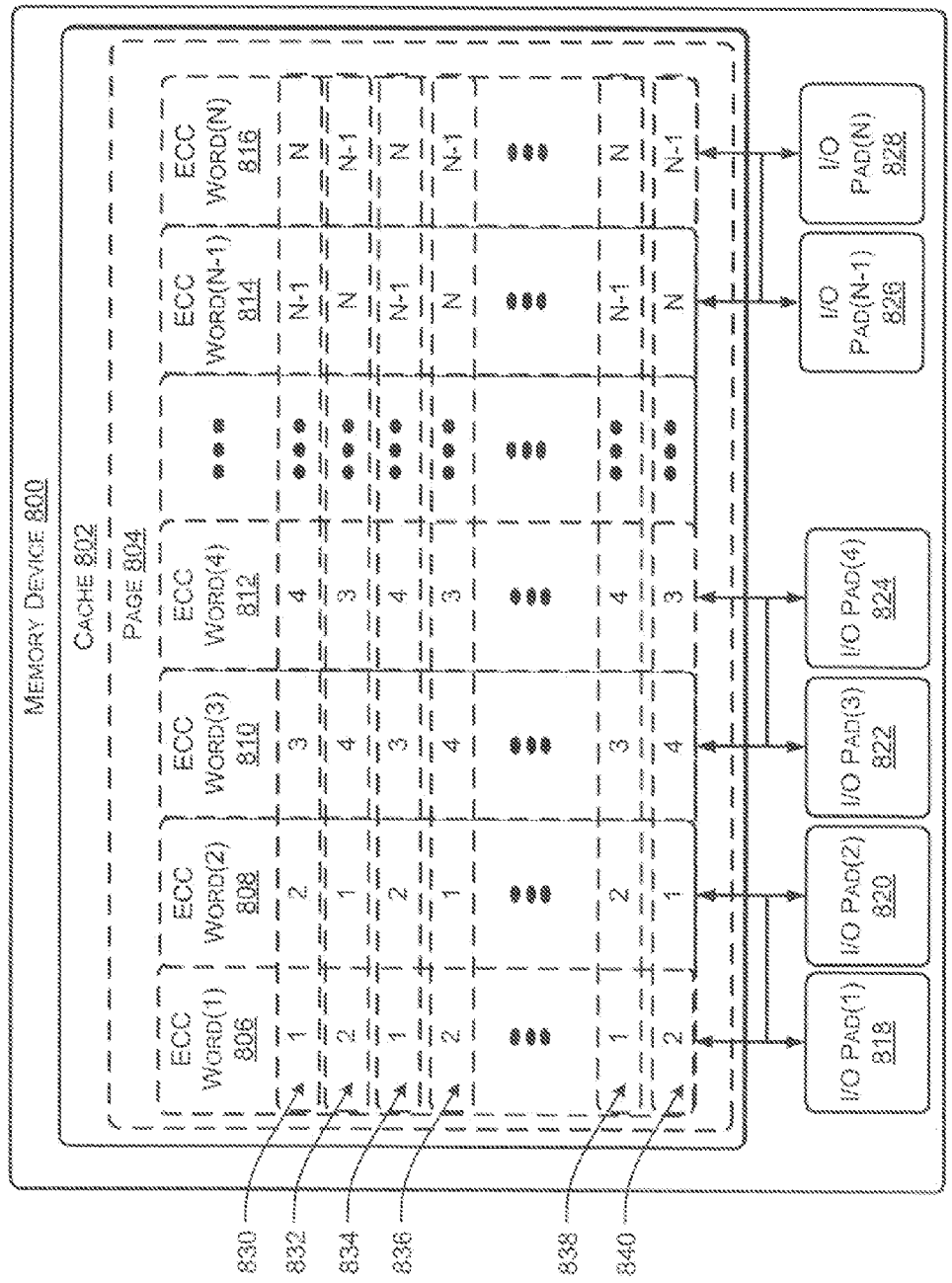
FIG. 8 illustrates an example framework including an example memory device according to some implementations.

FIG. 8 illustrates an example framework including an example memory 800 device according to some implementations. In some cases, to improve the processing speed associated with the memory device 800, the memory device 800 may be configured such that for adjacent accesses, the same I/O pad does not receive data associated with the same ECC word. For instance, due to routing and other considerations associated with the memory array, having the same ECC word associated with the same I/O pad may result in data associated with some ECC words being processed more quickly than data associated with other ECC words. However, by interleaving or alternating which I/O pad services data associated with particular ECC words, the time associated with processing and/or routing the data associated with the page may be improved, thereby resulting in overall improvements of access speeds associated with the memory device 800. For instance, as shown in the illustrated example, the memory device 800 may be configured such that every two ECC words share two I/O pads with the data associated with each of the two ECC words alternating between the two I/O pads per access.

In the illustrated example, a cache 802 associated with the memory device 800 is storing a page 804 of data having been processed by the correction circuitry one ECC word at a time, as described above. In this example, the page 804 is arranged with N ECC words 806-816. The ECC words 806-816 are illustrated as being provided to I/O pads 818-828 in multiple accesses, generally indicated by 830-840. During each access 830-840, one bit of data associated with each of the ECC words 806-816 is passed to the I/O pads 818-828 for outputting to system level error correction circuitry and/or an external source accessing the data associated with the page 804.

In the illustrated example, the I/O pads 818-828 have been arranged in pairs, such that pairs of ECC words 806-816 share a pair of I/O pads 818-828. For instance, the ECC words 806 and 808 are configured to share the I/O pads 818 and 820, the ECC words 810 and 812 are configured to share I/O pads 822 and 824, and the ECC words 814 and 816 are configured to share I/O pads 826 and 828. In this example, during the access 830, data associated with the ECC word 806 is provided to the I/O pad 818, data associated with the ECC word 808 is provided to the I/O pad 820, data associated with the ECC word 810 is provided to the I/O pad 822, data associated with the ECC word 812 is provided to the I/O pad 824, data associated with the ECC word 814 is provided to the I/O pad 826, and data associated with the ECC word 816 is provided to the I/O pad 828. However, during the access 832, rather than sending the data associated with the same the ECC word 806-816 to the same I/O pad 818-828, the memory device 800 provides data associated with the ECC word 806 is provided to the I/O pad 820 (not I/O pad 818), data associated with the ECC word 808 is provided to the I/O pad 818 (not I/O pad 820), data associated with the ECC word 810 is provided to the I/O pad 824 (not I/O pad 822), data associated with the ECC word 812 is provided to the I/O pad 822 (not I/O pad 824), data associated with the ECC word 814 is provided to the I/O pad 828 (not I/O pad 826), and data associated with the ECC word 816 is provided to the I/O pad 826 (not I/O pad 828).

Thus, by sharing I/O pads, if the path associated with the I/O pad 818 is relatively short and the path associated with the I/O pad 820 is relatively long, the number of clock cycles associated with processing the data associated with the ECC word 806 and 808 may be relatively similar and the number of clock cycles that would be experienced by one ECC word always being processed by the long path is reduced. In this manner, the overall processing time associated with the memory device 800 is reduced, as the memory device 800 is no longer required to wait the number of clock cycles necessary to route data associated with a single ECC word over the long path.

In the present example, pairs of ECC words 806 and 808, 810 and 812, and 814 and 816 share respective pairs of I/O pads 818 and 820, 822 and 824, and 826 and 828. However, it should be understood that the number of I/O pads in each pair and/or the number of ECC words associated with the I/O pads may vary. For example, the data associated with each ECC word 806-816 may rotate through the I/O pads 818-828, as described below with respect to FIG. 9.

Figure 9:
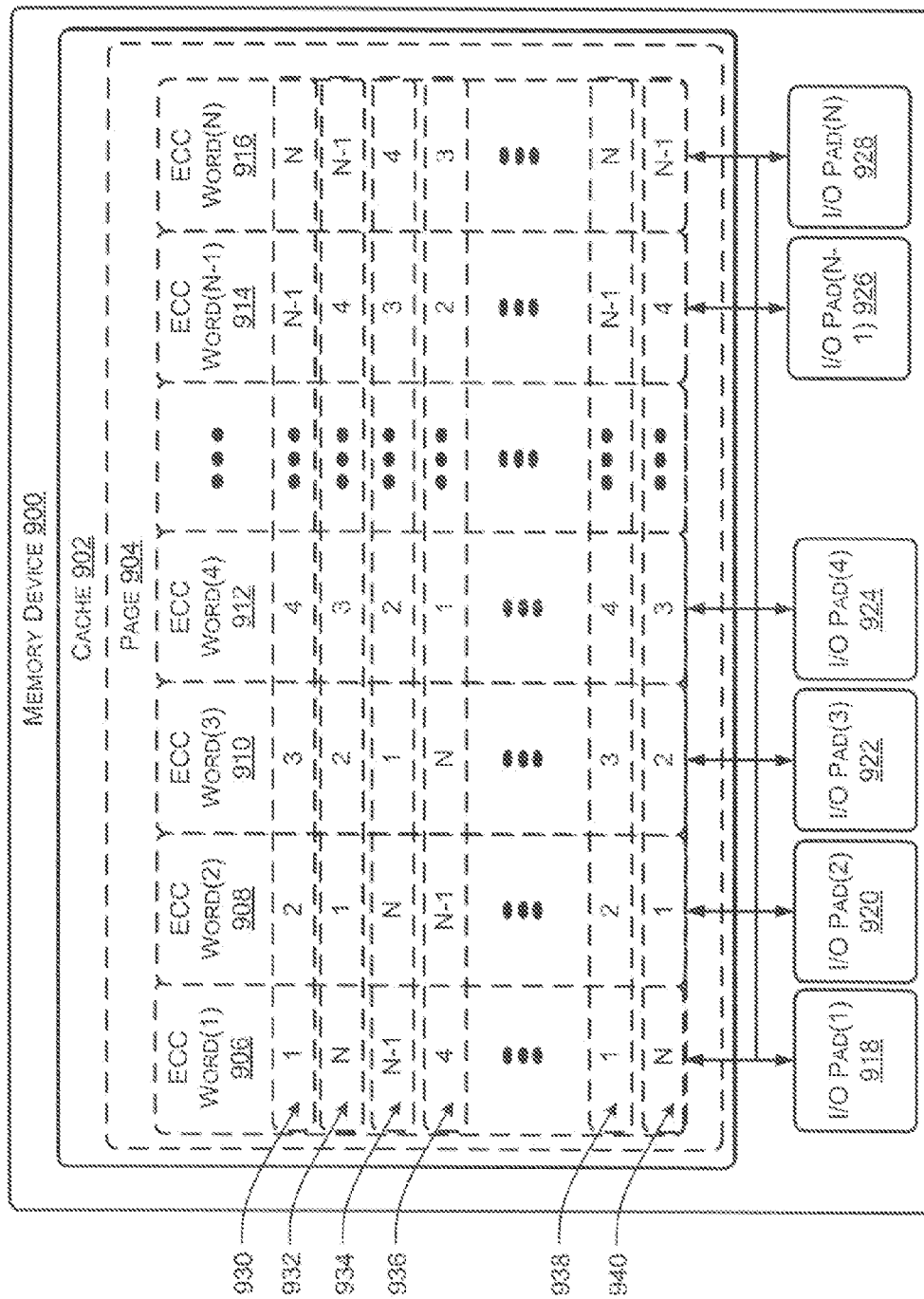
FIG. 9 illustrates an example framework including an example memory device according to some implementations.

FIG. 9 illustrates an example framework including an example memory device 900 according to some implementations. As described above with respect to FIG. 8, due to routing and other considerations associated with the memory array, having the same ECC word associated with the same I/O pad may result in data associated with some ECC words being processed more quickly than data associated with other ECC words. However, by interleaving or alternating which I/O pad services data associated with particular ECC words, the time associated with processing and/or routing the data associated with the page may be improved, thereby resulting in overall improvements of access speeds associated with the memory device 900.

In the illustrated example, a cache 902 associated with the memory device 900 is storing a page 904 of data having been processed by the correction circuitry one ECC word at a time, as described above. In this example, the page 904 is arranged with N ECC words 906-916. The ECC words 906-916 are illustrated as being provided to I/O pads 918-928 in multiple accesses, generally indicated by 930-940. During each of the accesses 930-940, one bit of data associated with each of the ECC words 906-916 is provided to the I/O pads 918-928 to be output to system level error correction circuitry and/or an external source (not shown in FIG. 9) accessing the data associated with the page 904.

In the illustrated example, the I/O pads 918-928 have been arranged to receive data associated with the ECC words 906-916. For example, during access 930, the memory device 900 provides data associated with ECC word 906 to the I/O pad 918, data associated with ECC word 908 to the I/O pad 920, data associated with ECC word 910 to the I/O pad 922, data associated with ECC word 912 to the I/O pad 924, data associated with ECC word 913 to the I/O pad 926, and data associated with ECC word 916 to the I/O pad 928. However, during the access 932, the memory device 900 shifts the paring of the ECC word 906-916 to the I/O pad 918-928. For instance, during the access 932, the memory device 900 provides data associated with ECC word 906 to the I/O pad 920 (not I/O pad 918), data associated with ECC word 908 to the I/O pad 922 (not I/O pad 920), data associated with ECC word 910 to the I/O pad 924 (not I/O pad 922), data associated with ECC word 912 to the I/O pad 926 (not I/O pad 924), data associated with ECC word 913 to the I/O pad 928 (not I/O pad 926), and data associated with ECC word 916 to the I/O pad 918 (not I/O pad 928). In the illustrated example, the shifting of ECC word to I/O pad continues until the entire page is read, thereby reducing the number of clock cycles associated with the long routing paths.

It should be understood that while FIG. 8 illustrates sharing of I/O pads between two ECC words and FIG. 9 illustrates sharing of data associated with each ECC word of a page over all of the I/O pads, other arrangements may be used. For example, the sharing may take on a random paring of ECC word to I/O pad upon each access or the I/O pads may be paired according to routing length (e.g., I/O pads 918 and 922 share ECC words 910 and 916). Furthermore, the number of I/O pads may be less than that of ECC words, in which case, an I/O pad would be shared and alternated between two or more ECC words during adjacent or different accesses.

Figure 10:
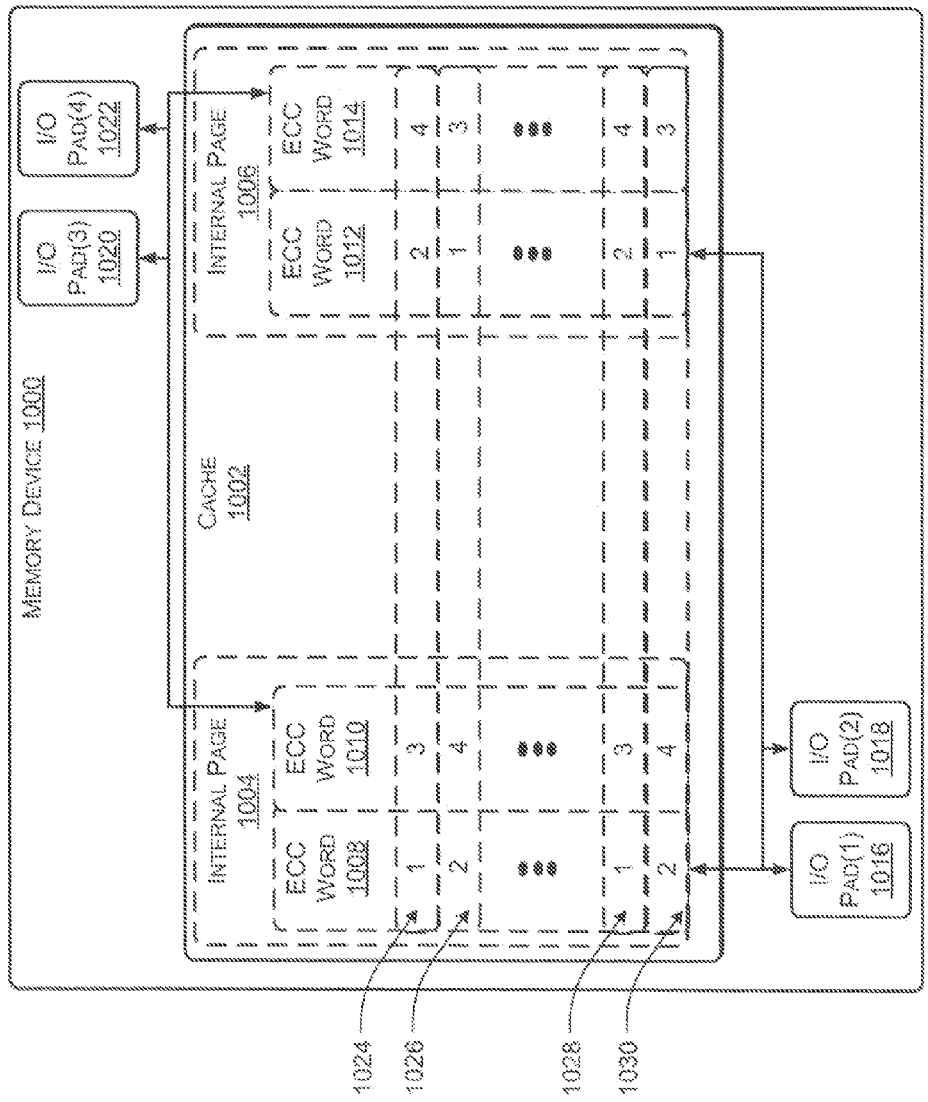
FIG. 10 illustrates an example framework including an example memory device according to some implementations.

FIG. 10 illustrates an example framework including an example memory device 1000 according to some implementations. As described above with respect to FIGS. 3-7, in some cases the memory device 1000 may process more than one internal page as if the pages were organized as a single external page to improve flexibility and operability of the memory device 1000. In these implementations, the memory device 1000 may still be configured to route different ECC words associated with the internal pages to different I/O pads to improve overall access speed associated with the memory device 1000.

In the illustrated example, a cache 1002 associated with the memory device 1000 is storing two internal pages 1004 and 1006 of data associated with a single external page having been processed by the correction circuitry one ECC word at a time, as described above. In this example, the internal page 1004 is arranged with two ECC words 1008 and 110 and the internal page 1006 is arranged with two ECC words 1012 and 1014. The ECC words 1008-1014 are illustrated as being provided to I/O pads 1016-1022 in multiple accesses, generally indicated by 1024-1030.

In the illustrated example, the I/O pads 1016-1022 have been arranged to receive data associated with the ECC words 1008-1014. For example, during access 1024, the memory device 1000 provides data associated with ECC word 1008 associated with the internal page 1004 to the I/O pad 1016, data associated with ECC word 1012 associated with the internal page 1006 to the I/O pad 1018, data associated with ECC word 1010 associated with the internal page 1006 to the I/O pad 1020, and data associated with ECC word 1014 associated with the internal page 1006 to the I/O pad 1022.

During access 1026, rather than sending the data associated with the same ECC word 1008-1014 to the same I/O pad 1016-1022, the memory device 1000 provides data associated with the ECC word 1008 to the I/O pad 1018, data associated with the ECC word 1012 to the I/O pad 1016, data associated with the ECC word 1010 to the I/O pad 1022, and data associated with the ECC word 1014 to the I/O pad 1020. In this manner, the memory device 1000 is able to share I/O pads between multiple internal pages not just between internal pages of the memory device 1000 to improve processing speed.

Figure 11:
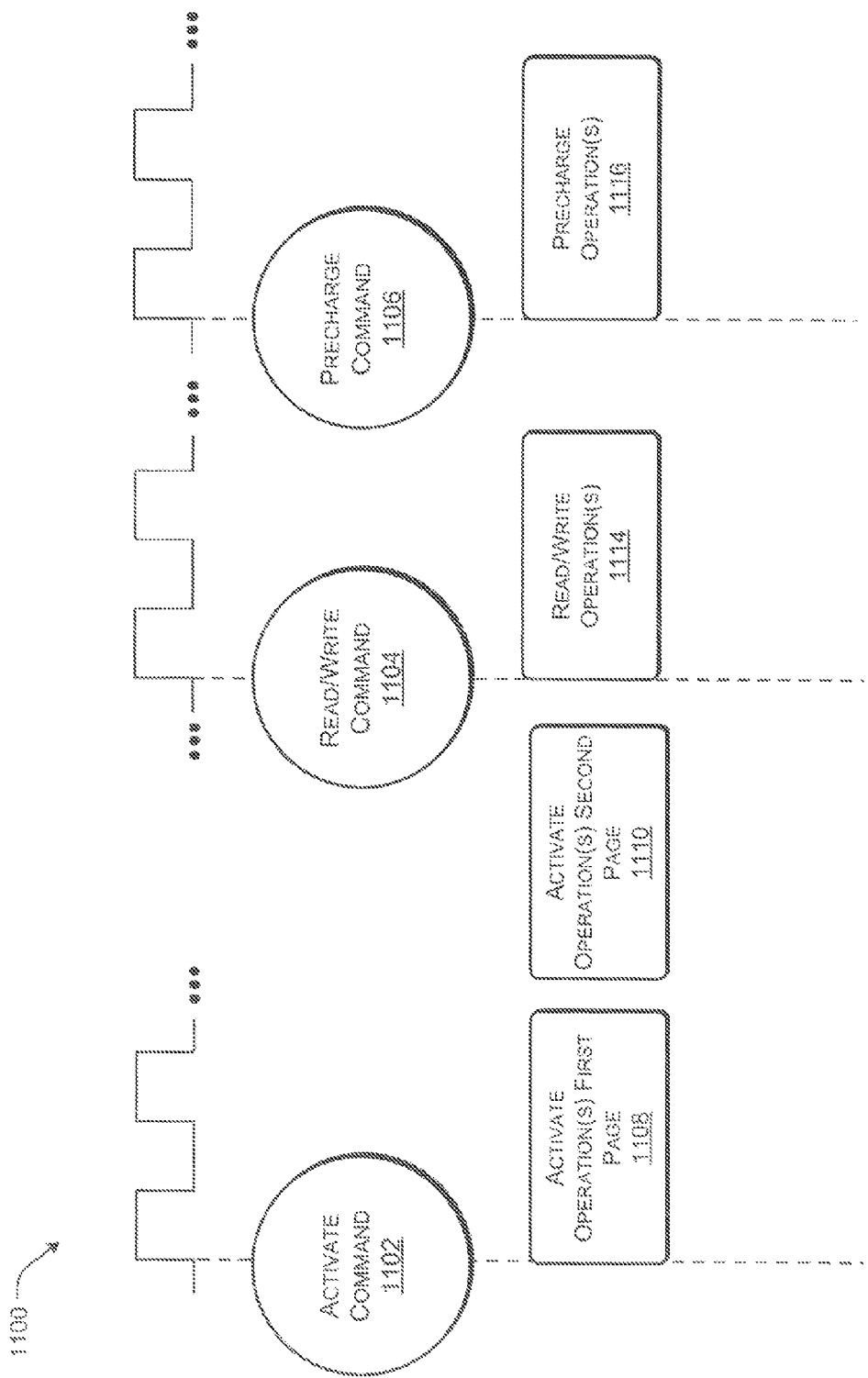
FIG. 11 illustrates an example timing diagram associated with a memory device according to some implementations.

FIG. 11 illustrates an example timing diagram 1100 associated with a memory device according to some implementations. As described above with respect to FIGS. 3-7, in some cases the memory device may process more than one internal page, as if the pages were organized as a single external page to improve flexibility and operability of the memory device. In these implementations, the memory device may be configured to receive a predetermined series of commands from an external source. For example, the memory device may be configured to receive an activate command 1102, one or more read and/or write commands 1104, and a precharge command 1106. In this example, the memory device may be configured to load two internal pages into a cache in response to receiving the activate command, for instance, when the external source is configured to access data according to an external page size different than the internal page size associated with the memory device.

In the present example, timing diagram 1100 illustrates events associated with an external source accessing a page of data of an external page size larger than an internal page size utilized by the memory device storing the data. The timing diagram 1100 is illustrated from the perspective of the memory device as the memory device receives commands from the external source and performs activate operations 1108 to load the first page into a cache and activate operations 1110 to load the second page into a cache, one or more read and/or write operations 1114 to read and/or edit the data stored in the cache, and one or more precharge operations 1116 to write the data in the cache back into a memory array.

In the illustrated example, the memory device is shown as performing multiple sets of activate operations 1108 and 1110 in response to receiving an activate command 1102. The number of activate operations performed by the memory device is based at least in part on a relationship of an external page size associated with the accessing source and the internal page size associated with a memory array of the memory device. In this example, assume that the external source desires to read and/or write data to a particular page of the external page size of 1024 bits and the internal page size is 512 bits. In order to do so, the external source issues the activate command 1102 to the memory device to cause the memory device to load the particular page of the external page size (1024 bits) into the cache. Following receipt of the activate command 1102, the memory device performs both the activate operations 1108 and 1110 to load a first page of the internal page size (512 bits) or the first half of the data associated with the external page into the cache and a second page of the internal page size (512 bits) or the second half of the data associated with the external page into the cache.

In this example, during a first period of time, the memory device passes each ECC word associated with the first internal page, either one ECC word at a time or all ECC words at the same time, through an associated error correction circuit capable of correcting at least one error per ECC word. The memory device then loads the data associated with the ECC word into the cache. Then, during a second period of time, the memory device passes each ECC word associated with the second internal page, either one ECC word at a time or all ECC words at the same time, through the associated error correction circuit capable of correcting at least one error per ECC word and then loads the data associated with the ECC word into the cache.

The memory device outputs the data stored in the cache to the external source, in response to receiving the read/write command 1104. The memory device may be configured to output the data according to accesses that include no more than one bit per ECC word associated with both the first and second internal pages. In this manner, a system level error correction circuit is able to correct additional errors even if the error is within the same ECC word. Once the external source is finished reading and writing the data stored in the cache, the external source issues the precharge command 1106 and the memory device writes the data in the cache back into the memory array.

Figure 12:
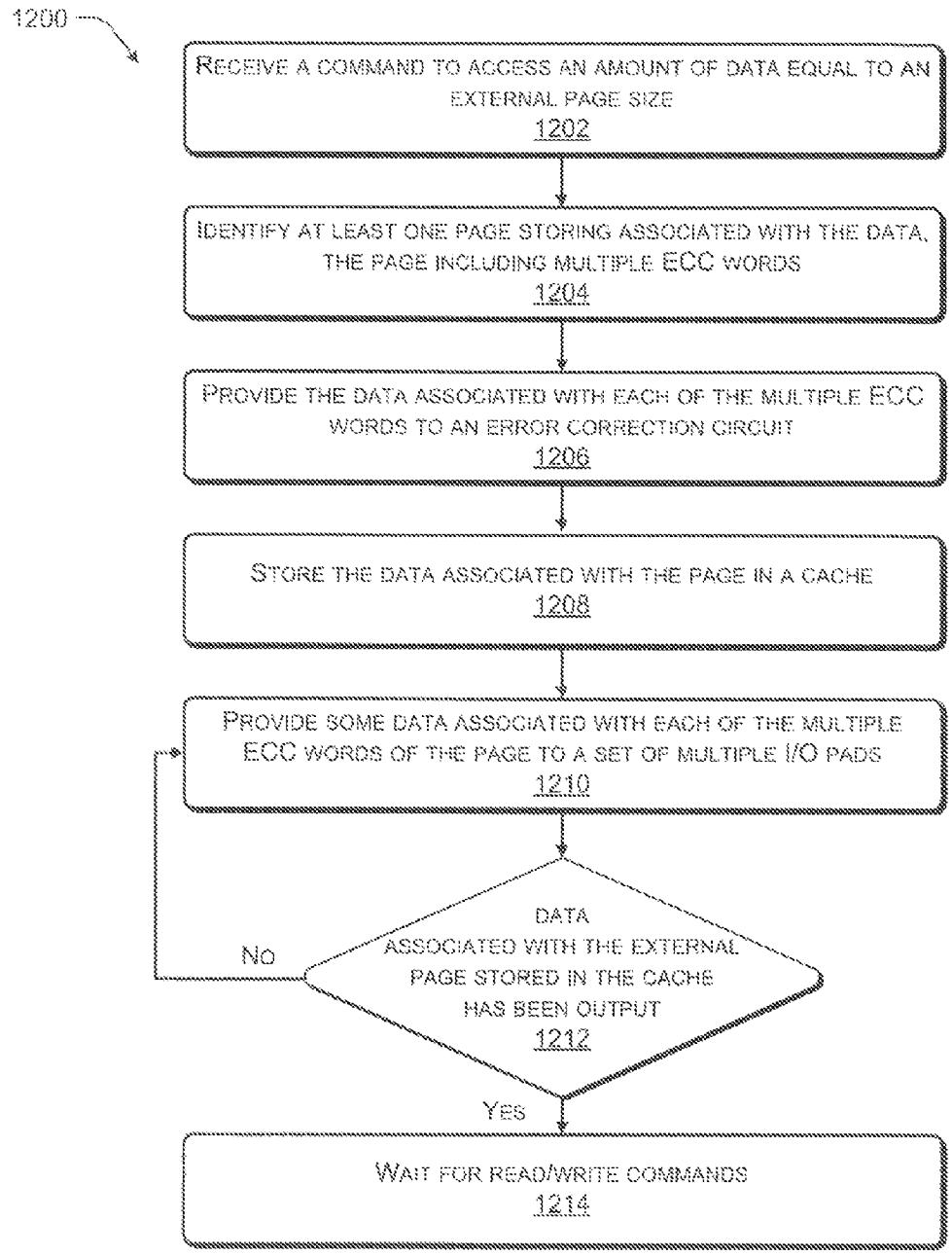
FIG. 12 illustrates an example flow diagram showing an illustrative process according to some implementations.
Figure 13:
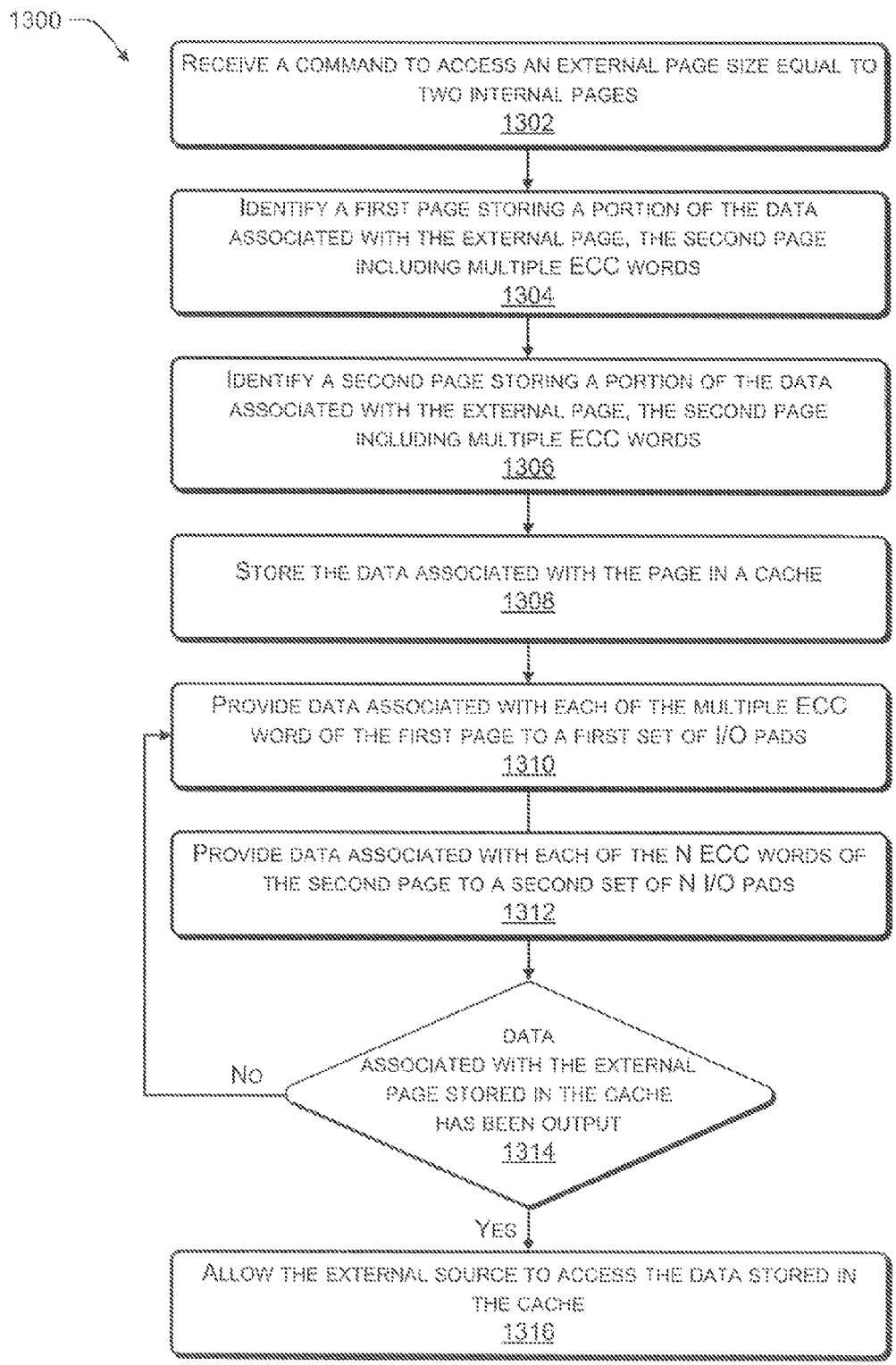
FIG. 13 illustrates an example flow diagram showing an illustrative process according to some implementations.
Figure 14:
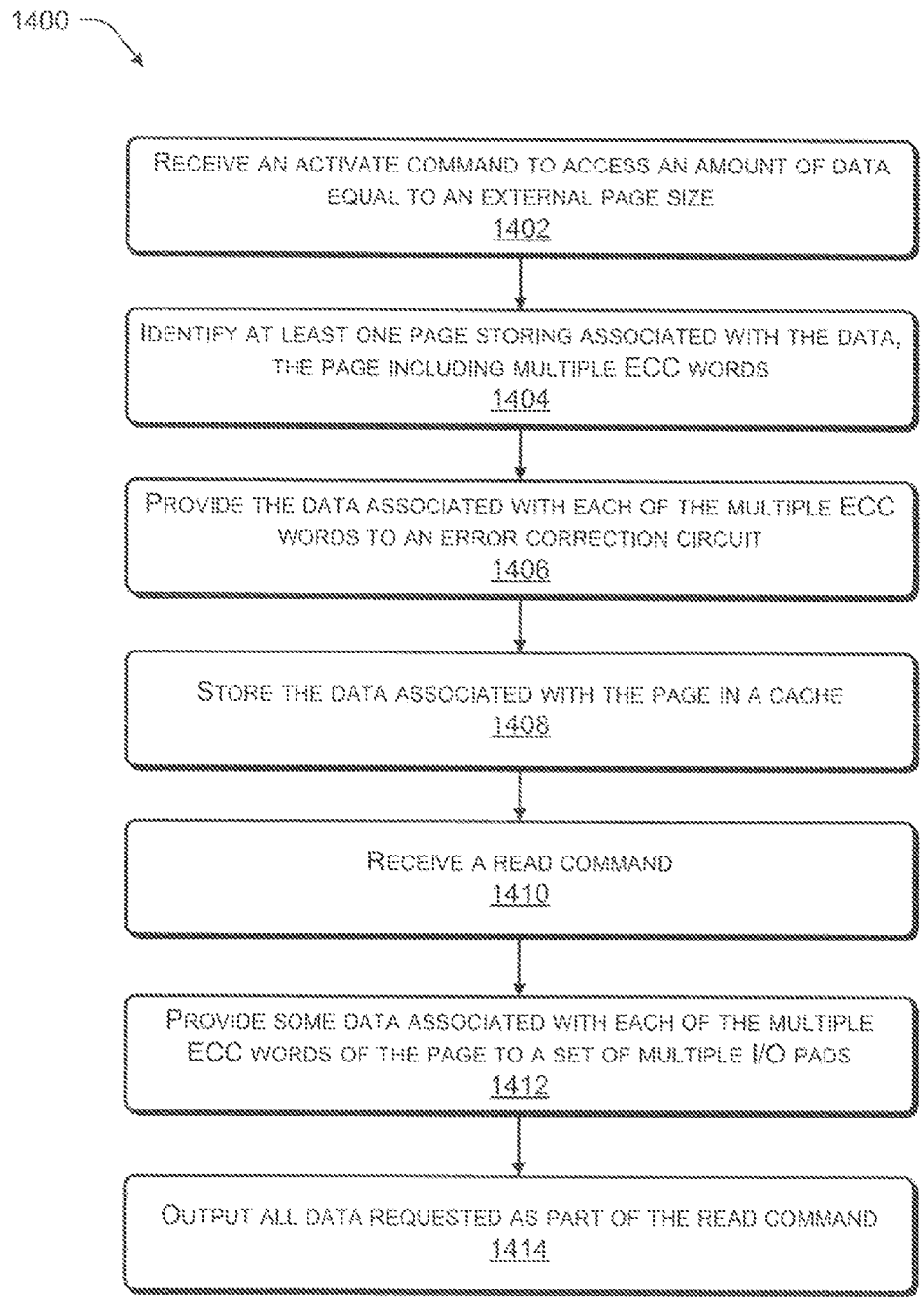
FIG. 14 illustrates an example flow diagram showing an illustrative process according to some implementations.

FIGS. 12, 13 and 14 are flow diagrams illustrating example processes associated with memory devices having multiple ECC words per page. The processes are illustrated as a collection of blocks in a logical flow diagram, which represent a sequence of operations, some or all of which can be implemented in hardware, software or a combination thereof. In the context of software, the blocks represent computer-executable instructions stored on one or more computer-readable media that, which when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 12 illustrates an example flow diagram showing an illustrative process 1200 according to some implementations. In general, the process 1200 may be implemented by a memory device having memory arrays storing data arranged in multiple ECC words per page and at least one I/O pad per ECC word. At 1202, the memory device receives a command to access an amount of data equal to an external page size. For instance, the memory device may store data according to an internal page size but may include one or more modes to allow an external source to access the data according to an external page size equal to or larger than the internal page size.

At 1204, the memory device identifies at least one page storing the data. The data associated with the page may be arranged in multiple ECC words. For example, the memory device may be configured to include one error correction circuit for each of the multiple ECC words per page, such that each circuit may correct one or more errors associated with a particular ECC word. In other examples, the memory device may be configured to include one I/O pad per ECC word per page, such that each I/O pad may receive one bit from each of the multiple ECC words per access or output to the external system.

At 1206, the memory device provides the data associated with each of the multiple ECC words to an error correction circuit. For example, the memory device may be configured such that each ECC word may be processed by a particular error correction circuit. In one particular instance, the memory device may provide the data associated with each ECC word to a corresponding error correction circuit until all the data associated with the page is stored in a cache.

At 1208, the memory device stores the data associated with the page in a cache. For example, if the memory device is configured with multiple error correction circuits, the memory device may process the data associated with a first ECC word before processing the data associated with the other ECC words, and store the data associated with the first ECC word in the cache. In this manner, each ECC word may be processed then stored in the cache until all the data associated with the page is stored.

At 1210, the memory device provides some data associated with each of the multiple ECC words to a set of multiple I/O pads. For example, the number of I/O pads may equal the number of ECC words per page and the memory device may provide one bit of data associated with each of the multiple ECC words to one of the multiple I/O pads, as part of a single access. In this manner, the system level error correction may be considered orthogonal or independent of the error correction performed by the memory device. For instance, each ECC word may be capable of correcting a single error, however, errors may pass through an ECC word when multiple errors exist in the ECC word. Then, if the data associated with an access (e.g., the data output at one time by the I/O pads) is associated with multiple ECC words and multiple errors occur within the same ECC word, each error is associated with different access and the system level error correction is able to correct all errors within one ECC word, provided there are no errors on the other ECC words.

At 1212, the memory device determines if the data associated with external page has been output by the I/O pads. If not, the process 1200 returns to 1210 and the memory device provides data associated with each of the N ECC words to the I/O pads, as part of another access. If the data associated with the external page has been output, the process 1200 proceeds to 1214 and the memory device waits for a read or write command from the external source.

FIG. 13 illustrates an example flow diagram showing an illustrative process 1300 according to some implementations. In general, the process 1300 may be implemented by a memory device having memory arrays storing data arranged in multiple ECC words per page and at least one I/O pad per ECC word per page. At 1302, the memory device receives a command to access an amount of data equal to an external page size. For instance, the memory device may store data according to an internal page size but include one or more modes to allow an external source to access the data according to an external page size equal to or larger than the internal page size.

At 1304, the memory device identifies a first page storing the data associated with the external page. The data associated with the page may be arranged in multiple ECC words. For example, the memory device may be configured to include one error correction circuit for each of the multiple ECC words per page, such that each circuit may correct one or more errors associated with a particular ECC word. In other examples, the memory device may be configured to include one I/O pad per ECC word per page, such that each I/O pad may receive one bit from each of the multiple ECC words per access or output to the external system.

At 1306, the memory device identifies a second page storing the data associated with the external page. The data associated with the page may again be arranged in multiple ECC words. For example, the memory device may be configured to include twice the number of error correction circuits than the number of ECCs per internal page or the number of ECC words associated with the external page. In other examples, the memory device may be configured to time multiplex the output of each internal page, such that the memory device may utilize a set of error correction circuits equal to the number of ECC words per internal page to process the first internal pages, and store the data associated with the first internal page in a cache.

At 1308, the memory device stores the data associated with the first and second internal pages in a cache. For example, the memory device may be configured to time multiplex the processing of the first internal page and the second internal page. For instance, during a first period of time, the memory device may provide data associated with the first internal page to the error correction circuits and store the data in the cache. Then, during a second period of time, the memory device may provide data associated with the second internal page to the error correction circuits and store the data in the cache.

At 1310, the memory device provides some data associated with each of the multiple ECC words of the first page to a first set of I/O pads and, at 1312, the memory device provides some data associated with each of the ECC words of the second page to a second set of I/O pads. For example, the memory device may provide one bit of data associated with each of the ECC words of the first page to the first set of I/O pads and one bit of data associated with each of the ECC words of the second page to a second set of I/O pads, as part of a single access. In this manner, the system level error correction may receive the data that was organized as a single external page instead of two internal pages.

Additionally, the system level error correction applied to each access may be considered orthogonal or independent of the error correction performed by the memory device. For instance, each ECC word may be capable of correcting a single error, however, errors may pass through an ECC word when multiple errors exist in the ECC word. Then, if the data associated with an access (e.g., the data output at one time by the I/O pads) is associated with multiple ECC words and multiple errors occur within the same ECC word, the errors are associated with different access and the system level error correction is able to correct each error, provided that there are no errors on the other ECC words.

At 1314, the memory device determines if the data associated with the external page has been output by the I/O pads. If not, the process 1300 returns to 1310 and the memory device provides data associated with each of the multiple ECC words of the external page (e.g., both internal pages) to the I/O pads, as part of another access. If the data associated with the external page has been output, the process 1300 proceeds to 1316 and the memory device waits for a read or write command from the external source.

FIG. 14 illustrates an example flow diagram showing an illustrative process 1400 according to some implementations. In general, the process 1400 may be implemented by a memory device having memory arrays storing data arranged in multiple ECC words per page and at least one I/O pad per ECC word. At 1402, the memory device receives an activate command to access an amount of data equal to an external page size. For instance, the memory device may store data according to an internal page size but may include one or more modes to allow an external source to access the data according to an external page size equal to or larger than the internal page size.

At 1404, the memory device identifies at least one page storing the data. The data associated with the page may be arranged in multiple ECC words. For example, the memory device may be configured to include one error correction circuit for each of the multiple ECC words per page, such that each circuit may correct one or more errors associated with a particular ECC word. In other examples, the memory device may be configured to include one I/O pad per ECC word per page, such that each I/O pad may receive one bit from each of the multiple ECC words per access or output to the external system.

At 1406, the memory device provides the data associated with each of the multiple ECC words to an error correction circuit. For example, the memory device may be configured such that each ECC word may be processed by a particular error correction circuit. In one particular instance, the memory device may provide the data associated with each ECC word to a corresponding error correction circuit until all the data associated with the page is stored in a cache.

At 1408, the memory device stores the data associated with the page in a cache. For example, if the memory device is configured with multiple error correction circuits, the memory device may process the data associated with a first ECC word before processing the data associated with the other ECC words, and store the data associated with the first ECC word in the cache. In this manner, each ECC word may be processed then stored in the cache until all the data associated with the page is stored.

At 410, the memory device receives a read command associated with the data. For example, the external source may issue the read command to access the data stored in the cache in response to the activate command. In other examples, the memory device may receive a write command associated with the data from the external source.

At 1412, the memory device, in response to receiving the read command, may provide some data associated with each of the multiple ECC words to a set of multiple I/O pads. For example, the number of I/O pads may equal the number of ECC words per page and the memory device may provide one bit of data associated with each of the multiple ECC words to one of the multiple I/O pads, as part of a single access. In this manner, the system level error correction may be considered orthogonal or independent of the error correction performed by the memory device. For instance, each ECC word may be capable of correcting a single error, however, errors may pass through an ECC word when multiple errors exist in the ECC word. In this example, the error correction circuits may correct one error per ECC word. Then, if the data associated with an access (e.g., the data output at one time by the I/O pads) is associated with multiple ECC words and multiple errors occur within the same ECC word, the errors are associated with different access and the system level error correction is able to correct both, provided there are no errors on the other ECC words.

At 1414, the memory device outputs the data requested as part of the read command by the external source. For example, the memory device may output the data in multiple rounds with data associated with data associated with different ECC words output on each of the I/O pads in each round. In some cases, an ECC word may be assigned to a particular I/O pad, such that the particular I/O outputs data associated with the same ECC word during each round. In other cases, a particular I/O pad may output data associated with two or more ECC words, such that while each I/O pad outputs data associated with a different ECC word during each round the particular I/O pad may output data associated with the two or more ECC words (e.g., different ECC words).

While the orthogonal orientation between internal and external ECC words has been described, it should be understood that this orthogonal orientation can be applied to any words or groups where there is a correlation between the error rate of one bit and that of other bits within the word or group. For example, if an inversion bit is stored to control the state of a group of bits, each group and associated inversion bit may be associated with a single I/O to achieve orthogonality with regards to system ECC. In other examples, each group of bits associated with a single I/O per access may experience correlations between the error of the bits within the group due to physical location or physical closeness between each bit. For instance, in some cases, bits of the memory array located physically close to each other may experience soft errors caused by cosmic radiation, manufacturing defects, assembly defects, or other defects introduce during use (such as dielectric breakdown on a word line).

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. An electronic device comprising:
a system level error correction circuit;
a memory device including:
one or more memory arrays configured to store data associated with a first page, the data associated with the first page being organized in a first set of error correction code (ECC) words; and
one or more input/output pad for each of the ECC words of the first set of ECC words associated with the first page, the one or more input/output pads for communicating the data associated with the first page to the system level error correction circuit.

2. The electronic device as recited in claim 1, wherein the memory device further includes one or more error correction circuits for each of the ECC words of the first set of ECC words.

3. The electronic device as recited in claim 1, wherein each of the one or more input/output pads are configured to provide one bit of data associated with one of the ECC words of the first set of ECC words to the system level error correction circuit at a particular time.

4. The electronic device as recited in claim 1, wherein the memory device further includes a cache for storing the data associated with the first page before the data associated with the first page is output by the one or more input/output pads.

5. The electronic device as recited in claim 4, wherein data associated a first ECC word of the first set of ECC words is processed and stored in the cache before data associated with a second ECC word of the first set of ECC words is processed.

6. The electronic device as recited in claim 4, wherein:
the memory array stores data associated with a second page, the data associated with the second page being organized in a second set of ECC words, a number of ECC words associated with the second set of ECC words equal to a number of ECC words associated with the first set of ECC words; and
the memory device processes and stores the data associated with the first page in the cache before processing and storing the data associated with the second page in the cache.

7. The electronic device as recited in claim 6, wherein the one or more input/output pads include at least one input/output pad for each of the ECC words of the first set of ECC words and for each of the ECC words of the second set of ECC words.

8. A memory device comprising:
one or more memory arrays storing data associated with a first page, the data associated with the first page organized into multiple error correction code (ECC) words, the multiple ECC words including at least a first ECC word and a second ECC word;
a first input/output pad to provide a first bit of data associated with the first ECC word to an external source during an access; and a second input/output pad to provide a second bit of data associated with the second ECC word to the external source during the access.

9. The memory device as recited in claim 8, wherein the external source is a system level error correction circuit.

10. The memory device as recited in claim 8, wherein:
the first input/output pad to provide a third bit of data associated with the first ECC word to the external source during a second access; and
the second input/output pad to provide a fourth bit of data associated with the second ECC word to the external source during the second access.

11. The memory device as recited in claim 8, wherein:
the first input/output pad to provide a third bit of data associated with the second ECC word to the external source during a second access; and
the second input/output pad to provide a fourth bit of data associated with the first ECC word to the external source during the second access.

12. The memory device as recited in claim 8, further comprising:
a first error correction circuit associated with the first ECC word; and
a second error correction circuit associated with the second ECC.

13. The memory device as recited in claim 8, wherein:
the memory array stores data associated with a second page, the data associated with the second page being organized into multiple ECC words, a number of ECC words associated with the second page equal to a number of ECC words associated with the first page.

14. The memory device as recited in claim 8, wherein:
the memory array stores data associated with a second page, the data associated with the second page being organized into multiple ECC words, a number of ECC words associated with the second page equal to a number of ECC words associated with the first page; and
the memory device is configured to process the data associated with the first page during a first period of time and the data associated with the second page during a second period of time.

15. A method comprising:
identifying a first page of data requested by an external source, the data associated with the first page arranged into a plurality of error correction code (ECC) words; and
outputting the data associated with the first page to the external source via a plurality of accesses, during each of the accesses outputting one bit of data associated with each of the plurality of ECC words on a different input/output pad.

16. The method as recited in claim 15, wherein the identifying the first page is in response to receiving an activate command from the external source.

17. The method as recited in claim 15, further comprising storing the data associated with the first page in a cache before outputting the data associated with the first page to the external source.

18. The method as recited in claim 15, further comprising providing the data associated with the plurality of ECC words to a plurality of error correction circuits, each of the error correction circuits associated with a particular one of the plurality of ECC words.

19. The method as recited in claim 15, further comprising:
identifying a second page of data requested by the external source, the data associated with a second page arranged into a plurality of ECC words, a number of ECC words of the first page equal to a number of ECC words of the second page and wherein the data associated with the first page and the second page are equal to an external page size associated with the external source;
performing error checking on the data associated with each of the plurality of ECC words of the first page and storing the data associated with each of the plurality of ECC words of the first page during a first period of time;
performing error checking on the data associated with each of the plurality of ECC words of the second page and storing the data associated with each of the plurality of ECC words of the second page during a second period of time; and
outputting the data associated with the first page and the data associated with the second page to the external source via the plurality of accesses, during each of the accesses outputting one bit of data associated with each of the plurality of ECC words of the first page and each of the plurality of ECC words of the second page on a different input/output pad.

20. The memory device as recited in claim 14, wherein:
the first input/output pad provides the first bit of data associated with the first ECC word to an external source during the first period of time and a third bit of data associated with a third ECC word of the second page during the second period of time.

* * * * *